(12) United States Patent
Dischinger et al.

(10) Patent No.: US 7,499,815 B2
(45) Date of Patent: Mar. 3, 2009

(54) MACHINE RADIAL STACK GAP GENERATION AND CLEARANCE MANAGEMENT SYSTEM AND METHOD

(75) Inventors: Dave G. Dischinger, Tempe, AZ (US); Charles P. Silcox, Tempe, AZ (US); Amitabh Tandon, Bangalore (IN); Muralidharan Kendai, Madurai (IN); Karthikeswaran Kalusivalingam, Aruppukottai (IN)

(73) Assignee: Honeywell International Inc., Morristown, NJ (US)

( * ) Notice: Subject to any disclaimer, the term of this patent is extended or adjusted under 35 U.S.C. 154(b) by 189 days.

(21) Appl. No.: 11/592,467

(22) Filed: Nov. 2, 2006

(65) Prior Publication Data

US 2008/0109195 A1    May 8, 2008

(51) Int. Cl.
*G01B 5/28* (2006.01)
(52) U.S. Cl. .............................. 702/55; 702/33; 702/38; 702/57; 702/158; 702/182; 702/183; 324/260; 324/772; 324/545; 324/546; 340/537; 340/635
(58) Field of Classification Search ............... 702/38, 702/158, 33, 57, 182–183; 324/260, 772; 324/545–546; 340/537, 635
See application file for complete search history.

(56) References Cited

U.S. PATENT DOCUMENTS

| | | | |
|---|---|---|---|
| 6,148,494 A | 11/2000 | Bauer et al. | |
| 6,393,331 B1 | 5/2002 | Chetta et al. | |
| 6,434,441 B1 | 8/2002 | Beauchamp et al. | |
| 6,587,741 B1 | 7/2003 | Chetta et al. | |
| 6,625,507 B1 | 9/2003 | Dickerson et al. | |
| 6,763,324 B1 | 7/2004 | Pittman et al. | |
| 6,826,510 B2 | 11/2004 | Gong et al. | |
| 6,868,363 B2 * | 3/2005 | Baran et al. | 702/158 |
| 6,944,580 B1 | 9/2005 | Blume et al. | |
| 2002/0087293 A1 | 7/2002 | Thomas | |
| 2005/0149298 A1 * | 7/2005 | Soman et al. | 702/189 |

* cited by examiner

Primary Examiner—Tung S Lau
Assistant Examiner—Sujoy K Kundu
(74) Attorney, Agent, or Firm—Ingrassia Fisher & Lorenz, P.C.

(57) ABSTRACT

A system and method for readily generating radial clearance data for a radial clearance between locations on at least two parts in a rotating machine includes rendering an image of a cross section view of at least a portion of the machine on a display. The locations on the two parts are identified on the rendered cross section, and a radial stack path between the identified locations is automatically determined. The radial clearance between the identified locations when the machine is not operating is determined, based at least in part on the determined radial stack path. Data generated by a deflection analysis model of the machine are used to determine radial deflections of the identified locations during machine operation at one or more machine operating conditions. Data representative of the radial clearance between the identified locations during the machine operation at the one or more machine operating conditions are generated.

18 Claims, 20 Drawing Sheets

MACHINE RADIAL STACK GAP GENERATION AND CLEARANCE MANAGEMENT SYSTEM AND METHOD

TECHNICAL FIELD

The present invention relates to machine radial gaps and, more particularly, to a system and method for determining radial gaps in a machine both before and during operations at various conditions.

BACKGROUND

The individual parts that are used to build an operating machine are each designed and built according to various part dimensions. As is generally known, a part dimension is a numerical value that defines the size, shape or location of a feature. In many instances, the parts that comprise a machine are each described by one or more two-dimensional drawings. These drawings typically include part geometry, nominal part dimensions, part tolerances, and may additionally include various other part characteristics such as, for example, the material from which the part is to be constructed, and various mechanical properties such as tensile strength or hardness. The tolerance values, as is generally known, specify an acceptable range of variation from the nominal part dimension. A single part can be governed by a plurality of tolerances, each tolerance related to a different geometric feature of the part. For example, the drawings for an aircraft engine gas turbine blade may include as many as four hundred dimension tolerances.

Parts are preferably manufactured to conform to the associated drawings, considering both the nominal dimensions and the tolerances associated therewith. If a part is manufactured such that one or more of its actual dimensions is outside the tolerance range specified in the drawing, it may not be suitable for use in the machine. For example, it may not properly mate or interface with another part or may physically interfere with the operation of another part.

As the individual parts are assembled to form the machine, radial and axial gaps between parts are preferably maintained within design limits. A nominal gap distance represents the desired gap opening. A gap tolerance indicates a range of acceptable variations from the nominal gap distance. For example, in a gas turbine engine, combustion gases impinge upon a plurality of blades carried by a spinning rotor enclosed within a stationary shroud. Maintaining a specified gap (as defined by the nominal running gap distance and a tolerance range associated with the gap distance) between a tip of each rotor blade and the shroud ensures proper and efficient operation of the engine. Thus, dimension tolerance stack-up analyses are preferably conducted to ensure appropriate gaps are maintained.

Dimension tolerance stack-up analysis is a process of using given machine part dimensions and part tolerances to predict the dimension and tolerance of an assembly dimension between two mating or adjoining parts, e.g., to predict the nominal assembly dimension and tolerance of a machine gap. Typically, the gap stack-up analysis is performed manually, and includes identifying at least two parts and the dimensions of those parts that create the gap. These part dimensions form a stack path beginning at one gap surface, traversing through serial part interfaces until reaching the opposing gap surface. The part dimensions and part dimension tolerances associated with each such part are then combined to yield the gap nominal dimension and the gap tolerance. It may thus be appreciated that this analysis can be a rather tedious, time consuming, and potentially costly undertaking.

In addition, the operating efficiency of a gas turbine is at least partially dependent upon the radial clearance or gap between rotor blade tips and the shroud. If the clearance between the rotor blade tips and the surrounding shroud is too large, additional flow may leak through the gap between the rotor blade tips and the surrounding shroud, decreasing the turbine's efficiency. Conversely, if the clearance is too small, the rotor blade tips may strike the surrounding shroud during certain turbine operating conditions. To facilitate optimizing the turbine efficiency, the clearance is preferably adjusted to enhance steady-state performance while maintaining an adequate clearance margin as the turbine accelerates and decelerates. Moreover, a cold clearance that is initially relatively tight, can result in excessive regenerative rubs. Over time, continued rubs may cause loss of material and/or a blunt or mushroomed seal tooth which may change the flow characteristics and adversely affect the performance of the turbine. A balanced design may provide tight average operating clearances as well as facilitate avoiding rubs during transients and operating at off-design conditions.

Turbine radial clearances may change during periods of acceleration or deceleration due to changing centrifugal force generated in the rotor, and/or due to relative thermal growth between the rotating rotor and stationary shroud. During periods of differential centrifugal and thermal growth, clearance changes may result in rubbing of the moving blade tips against the stationary shroud. Such an increase in blade tip clearance results in efficiency loss. Since components of turbines and other rotating machines are, in many instances, made of different materials with different thicknesses, such components exhibit different rates of thermal growth from a cold startup condition to steady state operating condition and during transient operating conditions. Such differences make calculating gap clearances difficult and time consuming.

Hence, there is a need for a system and method that can readily determine at least radial gaps during both non-operational and operational conditions in a rotating machine. The present invention addresses at least this need.

BRIEF SUMMARY

The present invention provides a system and method for readily generating radial clearance data for a radial clearance between locations on at least two parts in a machine.

In one embodiment, and by way of example only, a method of generating radial clearance data for a radial clearance between locations on at least two parts in a rotating machine includes rendering an image of a cross section view of at least a portion of the machine on a display. The locations on the two parts are identified on the rendered cross section, and a radial stack path between the locations is automatically determined. The radial clearance between the locations on the two parts when the machine is not operating is determined, based at least in part on the determined radial stack path. Data generated by a deflection analysis model of the machine are used to determine radial deflections of the two parts during machine operation at one or more machine operating conditions. Data representative of the radial clearance between the locations on the two parts during the machine operation at the one or more machine operating conditions are generated.

In another exemplary embodiment, a system for implementing the above method is disclosed, and in still another embodiment, computer readable includes instructions for causing a computer to implement the above method.

Other independent features and advantages of the preferred system and method will become apparent from the following detailed description, taken in conjunction with the accompanying drawings which illustrate, by way of example, the principles of the invention.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background or the following detailed description. In this regard, although the following description is provided in the context of a rotating machine, it will be appreciated that the invention is applicable to machines and devices that do not include rotating components. Moreover, while the description is provided in the context of two-dimensional radial deflections, it will be appreciated the invention is readily applicable to three-dimensional radial deflections, as well.

Figure 1:
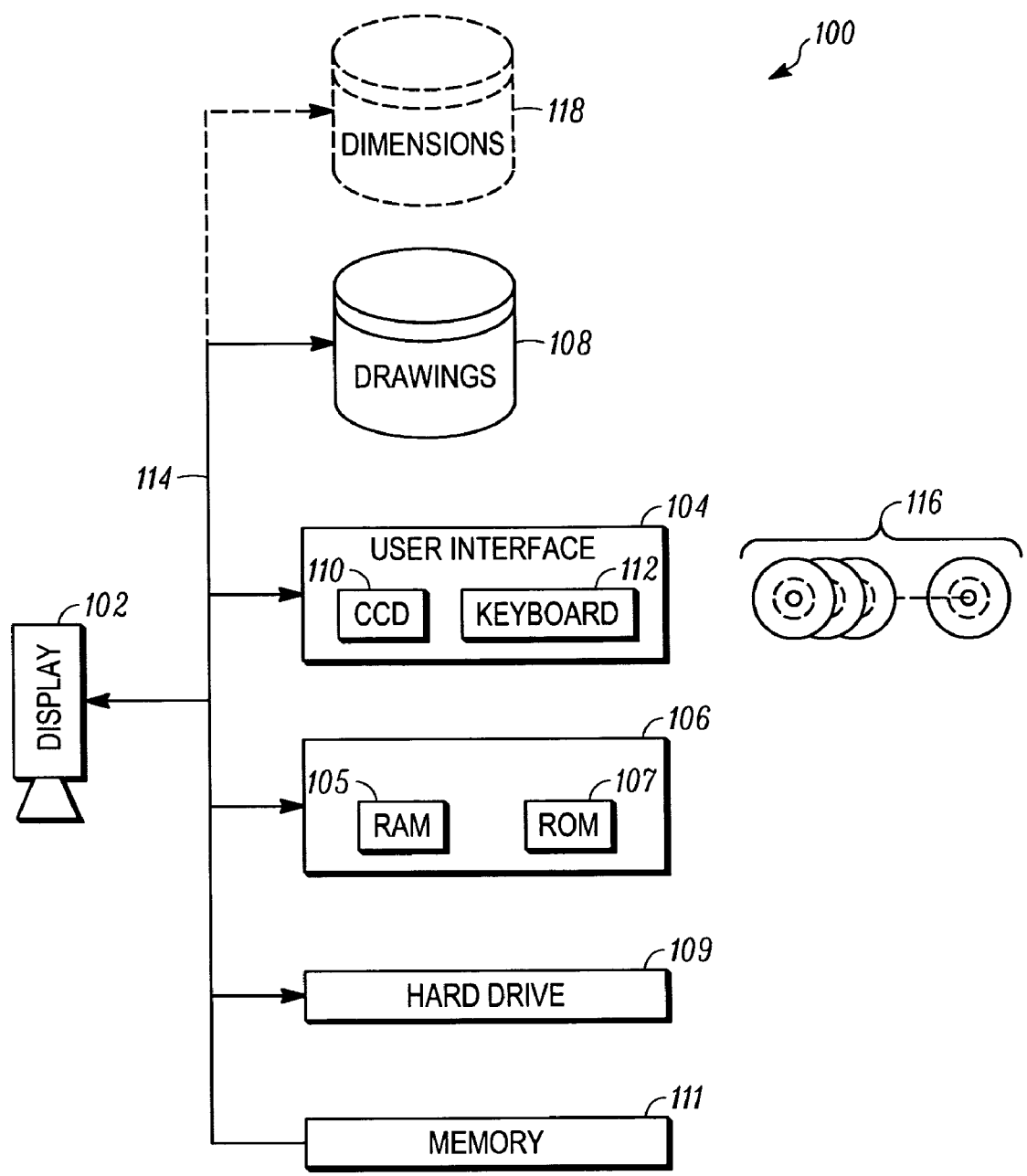
FIG. 1 is a functional block diagram of an exemplary system that may be used to generate and manage radial stack data.

Turning now to FIG. 1, a system 100 that may be used to implement the radial gap stack and deflection clearance methodology is depicted. The system 100 preferably includes a display device 102, a user interface 104, a processor 106, and a drawings database 108. The display device 102 is in operable communication with the processor 106 and, in response to display commands received therefrom, displays various images. It will be appreciated that the display device 102 may be any one of numerous known displays suitable for rendering graphic, icon, and/or textual images in a format viewable by a user. Non-limiting examples of such displays include various cathode ray tube (CRT) displays, and various flat panel displays such as, for example, various types of LCD (liquid crystal display) and TFT (thin film transistor) displays. The display device 102 may additionally be based on a panel mounted display, a head up display (HUD) projection, or any known technology.

The user interface 104 is in operable communication with the processor 106 and is configured to receive input from a user and, in response to the user input, supply various signals to the processor 106. The user interface 104 may be any one, or combination, of various known user interface devices including, but not limited to, a cursor control device (CCD), such as a mouse, a trackball, or joystick, and/or a keyboard, one or more buttons, switches, or knobs. In the depicted embodiment, the user interface 104 includes a CCD 110 and a keyboard 112. A user may use the CCD 110 to, among other things, move a cursor symbol over, and select, various items rendered on the display device 102, and may use the keyboard 112 to, among other things, input various data. A more detailed description of the why a user may select various rendered items with the CCD 110, and the various data that a user may input is provided further below.

The processor 106 is in operable communication with the display device 102, the user interface 104, and the drawing database 108 via, for example, one or more communication buses or cables 114. The processor 106 is configured to be responsive to user input supplied to the user interface 104 to, among other things, selectively retrieve one or more drawings from the drawing database 108, command the display device 102 to render retrieved drawings and various other graphical user interface tools, associate data that are retrieved or supplied automatically or input via the user interface 104 with component parts of rendered drawings, and to determine radial gap clearances between component parts of rendered drawings at various conditions.

The processor 106 may include one or more microprocessors, each of which may be any one of numerous known general-purpose microprocessors or application specific processors that operate in response to program instructions. In the depicted embodiment, the processor 106 includes on-board RAM (random access memory) 105, and on-board ROM (read only memory) 107. The program instructions that control the processor 106 may be stored in either or both the RAM 105 and the ROM 107, or on a local hard drive 109. It will be appreciated that this is merely exemplary of one scheme for storing operating system software and software routines, and that various other storage schemes may be implemented. It will also be appreciated that the processor 106 may be implemented using various other circuits, not just one or more programmable processors. For example, digital logic circuits and analog signal processing circuits could also be used.

The drawing database 108 preferably has various machine drawings stored therein. The machine types may vary, and may include, for example, various types of rotating machines, such as gas turbine engines, turbochargers, turbogenerators, compressors, and air cycle machines, just to name a few. It will additionally be appreciated that, although the drawing database 108 is, for clarity and convenience, shown as being stored separate from the processor 106, all or portions of this database 108 could be loaded into the on-board RAM 105, or integrally formed as part of the processor 106, and/or RAM 105, and/or ROM 107. The drawing database 108, or the data forming portions thereof, could also be part of one or more non-illustrated devices or systems that are physically separate from the depicted system 100.

As was previously noted, the processor 106 is responsive to user input supplied to the user interface 104 to, among other things, selectively retrieve one or more drawings from the drawing database 108, command the display device 102 to render retrieved drawings and various other graphical user interface tools, associate data that are retrieved or supplied automatically or input via the user interface 104 with component parts of rendered drawings, store at least portions of the supplied data in memory 111 (or a particular preferred database), and to determine radial gap clearances between component parts of rendered drawings at various conditions. The overall process 200 by which the processor 106 implements these outcomes is depicted in flowchart form in FIG. 2, and with reference thereto will now be described in more detail. Before doing so, however, it is noted that the depicted process 200 is merely exemplary of any one of numerous ways of depicting and implementing the overall process to be described. Moreover, the process 200 that is implemented by the processor 106 may be a software driven process that is stored, in whole or in part, on one or more computer-readable media, such as the media 116 depicted in FIG. 1. It will additionally be appreciated that the software may be stored, in whole or in part, in one or more non-illustrated memory devices and/or the RAM 105 and/or the ROM 107. With this background in mind, it is additionally noted that the numerical parenthetical references in the following description refer to like steps in the flowchart depicted in FIG. 2.

Figure 3:
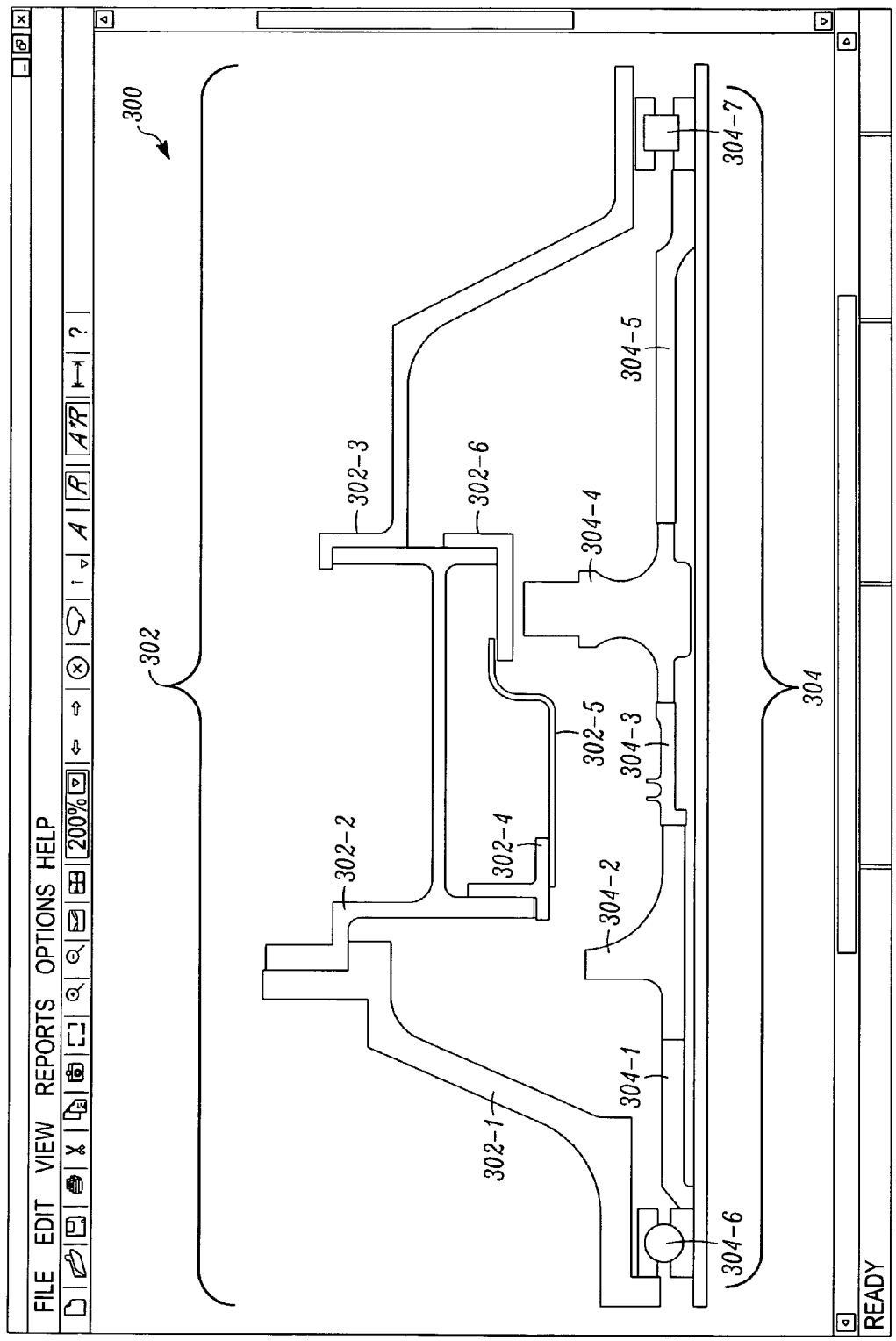
FIGS. 3-12 are exemplary screen shots of images that may be rendered on a display, using the system of FIG. 1, in implementing the exemplary method of FIG. 2.

Turning now to the description of the process 200, it is seen that when the process 200 is initiated (201), a user may retrieve a drawing from the drawing database 108 that preferably includes a cross section view, or a partial cross section view, of a rotating machine (202). Upon retrieval of a particular drawing, the display device 102 is commanded to render the cross section view, or partial cross section view, of the rotating machine (204). A simplified exemplary representation of a cross section view of a rotating machine 300 that may be rendered on the display device 102 is depicted in FIG. 3. For completeness and ease of understanding of the remaining description, this exemplary machine 300 will be briefly described. Before doing so, however, it is noted that the depicted machine 300 is not intended to represent any particular type of rotating machine and is provided merely to facilitate explanation of the process 200.

The depicted machine 300, as alluded to above, is a rotating machine and includes both a static section 302 and a rotating section 304. The static section 302, as the term connotes, does not rotate during machine 300 operation, and includes a plurality of static components 302-1, 302-2, 302-3, 302-4, 302-5, and 302-6. Conversely, the rotating section 304 does rotate during machine 300 operation, and includes a plurality of rotating components 304-1, 304-2, 304-3, 304-4, and 304-5. It is additionally seen that two bearing assemblies 304-6, 304-7 are disposed between the static section 302 and the rotating section 304. The bearing assemblies 304-6, 304-7, at least in the depicted embodiment, are assigned to the rotating section 304. It will be appreciated, however, that this is merely exemplary, and that the bearing assemblies 304-6, 304-7 could alternatively be assigned to the static section 302. Moreover, although the depicted machine 300 is defined by a static section 302 and a rotating section 304, it will be appreciated that the process 200 could also be applied to a machine that is defined by two or more rotating sections that rotate relative to each other. Moreover, the process 200 can be readily applied to determine gaps between static sections.

Returning once again to FIG. 2, after the drawing has been retrieved (202) and the cross section view, or partial cross section view, of the rotating machine has been rendered (204), one or more of the individual components of the rotating machine 300 are identified on the rendered cross section, and dimension data associated with the identified components are supplied (206). It will be appreciated that the individual components may be identified, and the dimension data supplied, using any one of numerous techniques. In a particular preferred embodiment, however, parts are identified by assigning each individual component a part name, identifying the part type (e.g., whether it is a static part or a rotating part), and then selecting two or more points (referred to herein as "key points") on each individual component to which a name has been assigned. The dimension data associated with an identified part may then be supplied. The naming of, assignment of part type, selection of key points on, and supply of dimension data associated with, individual components may be implemented using any one of numerous techniques. In a particular preferred embodiment, and with reference now to FIG. 4, it is seen that these actions are preferably accomplished by entering data, via the user interface 104, into appropriate fields within a dialog box 402. Although separate dialog boxes may be used for each of these actions, it is seen that a single dialog box 402, having a plurality of sub-menus 404-1, 404-2, 404-3 associated therewith, is used.

Figure 4:
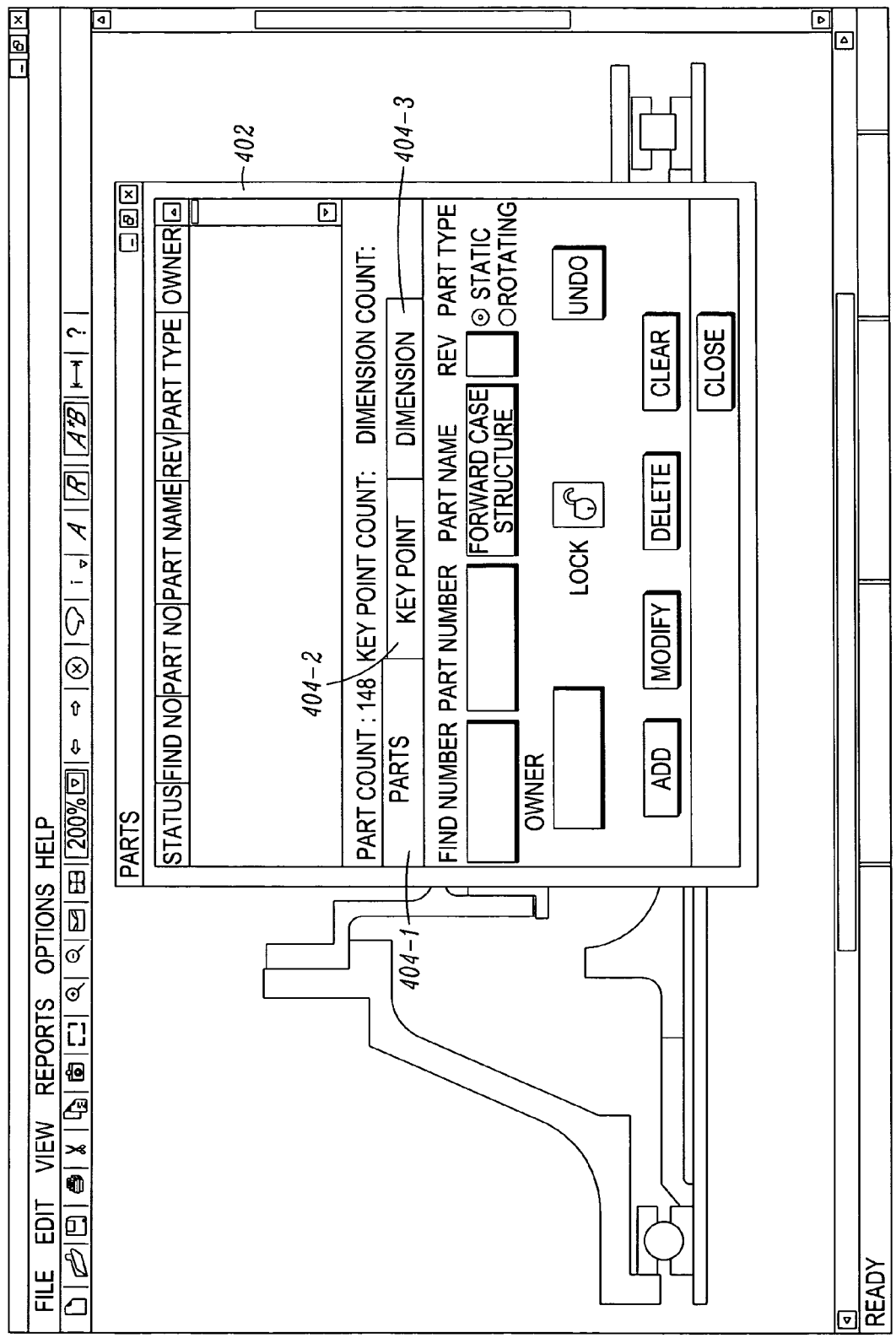
Figure 5:
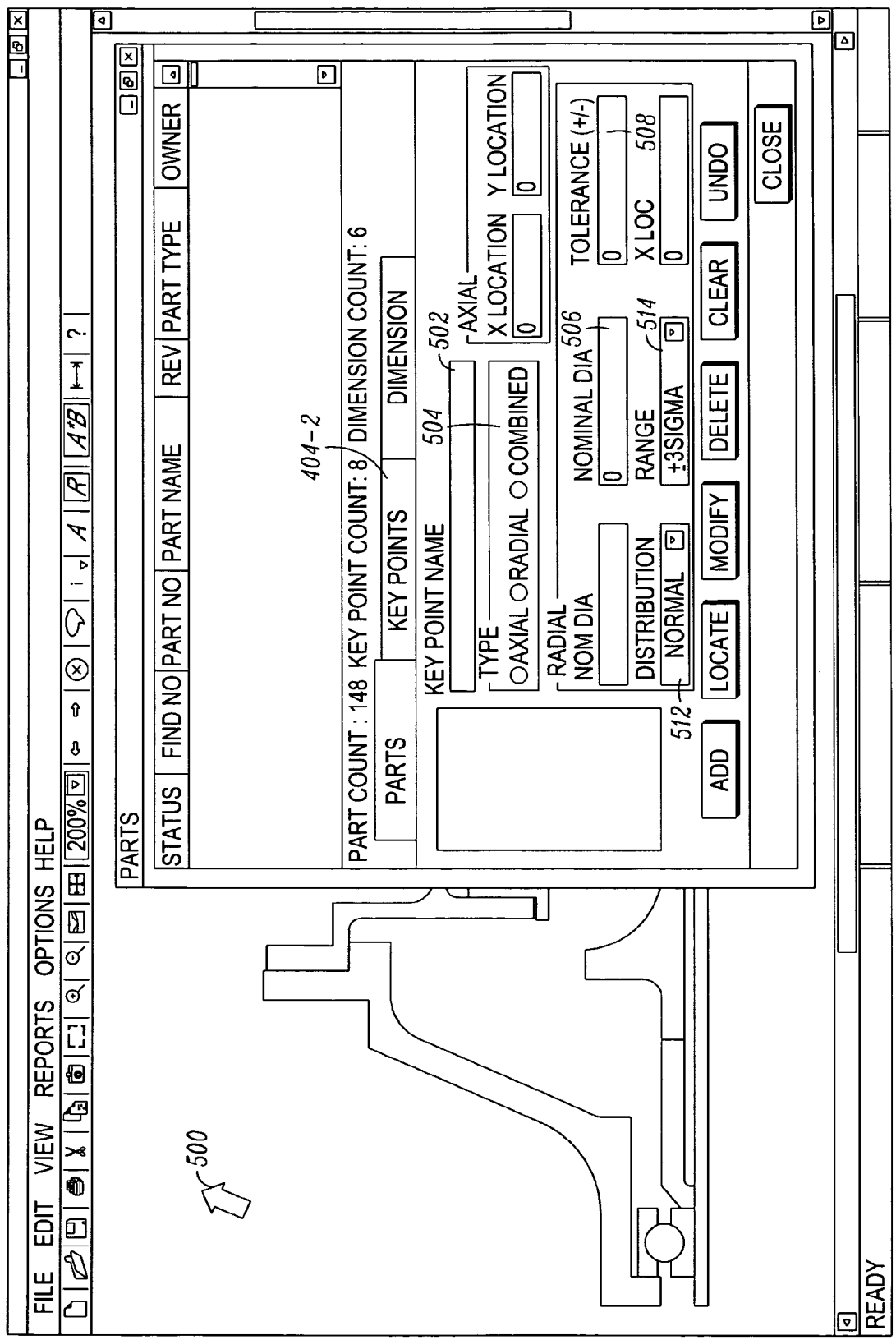

With continued reference to FIG. 4, it is seen that in the depicted embodiment part 302-1, using the "Parts" sub-menu 404-1, has been named "FORWARD CASE STRUCTURE" and is identified as a "Static" type of part. It will be appreciated that similar identifying indicia, including both name and part type, are preferably assigned, in a similar manner, to at least each part of interest in the rotating machine 300. After a component has been assigned a name and part type, two or more key points associated with that part are selected, preferably via the "KeyPoints" sub-menu 404-2, which is depicted in FIG. 5. Similar to the naming of each individual component, each key point is assigned a name 502 and a type 504. It will be appreciated that each key point may be categorized as an "Axial" key point, a "Radial" key point, or a "Combined" key point (e.g., a combination of both axial and radial types). It is noted that for "Radial" key points types, additional fields are provided into which a user may enter a nominal part diameter 506 and tolerance 508. In a particular preferred embodiment, the sub-menu 404-2 additionally enables a user to select an assumed distribution 512 and range 514 for the nominal part diameter data supplied via the nominal part diameter field 506. For example, the user may be enabled to select a normal distribution over a given range (i.e., ±1σ, ±2σ, ±3σ, etc.), or a uniform distribution. It is noted that the individual key point diameters are used to compute concentric radial gaps between any two key points and/or interface gaps, which may subsequently be used to compute relative positions between any two interfacing key points.

Figure 6:
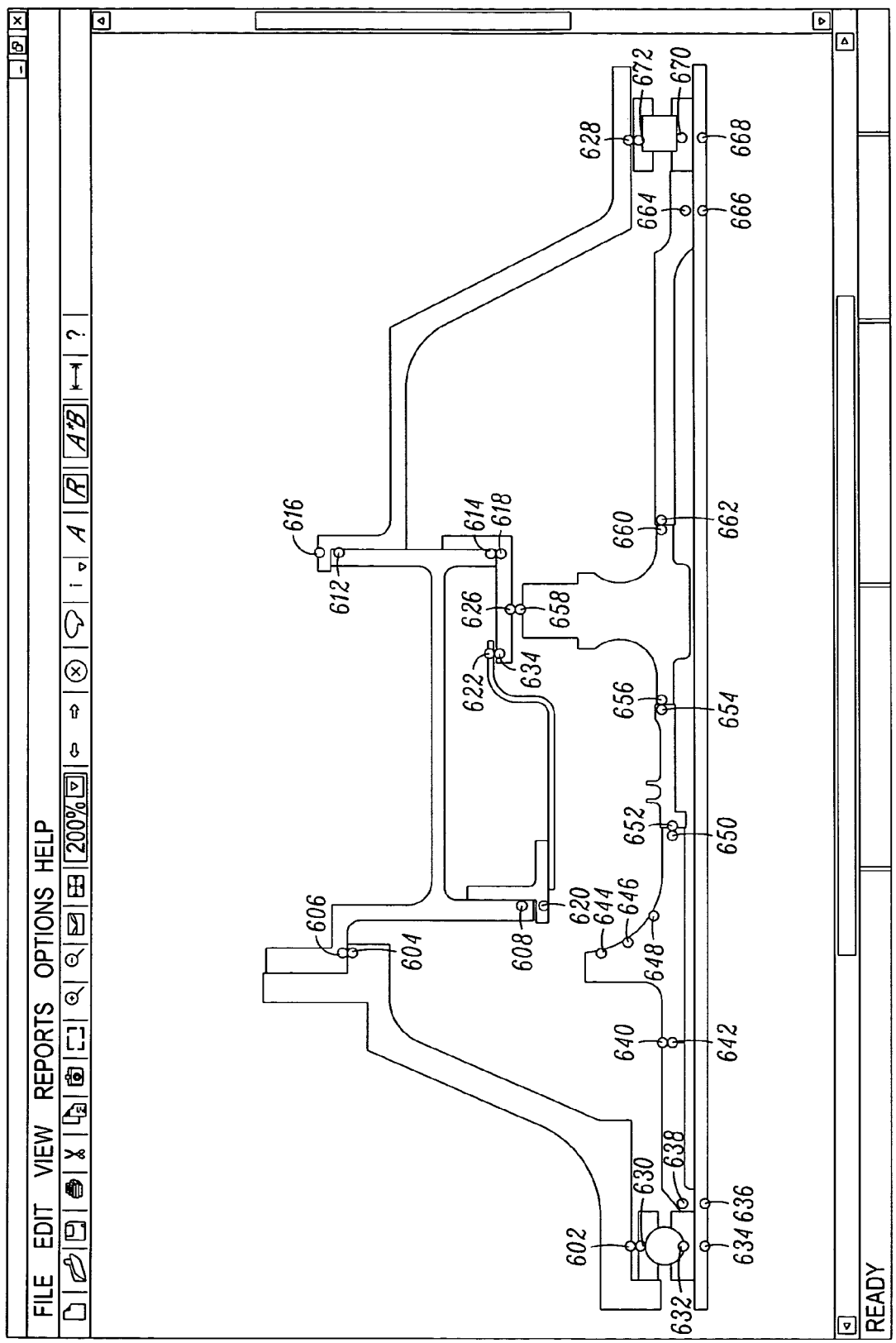

In any case, after each key point has been assigned a name and type, it is then located on the rendered cross section. In the depicted embodiment this is implemented using the user interface 104, and most preferably by moving a cursor 506, using the CCD 110, onto the appropriate location on the part that is to correspond to the key point. The key point is then associated with that location by supplying appropriate user input, such as one or more clicks on a button on the CCD 110 and/or via the keyboard 112. As an example resultant of this operation, it is seen in FIG. 6 that two key points 602-672 have been associated with, and rendered on, each component of interest in both the static section 302 and the rotating section 304.

Figure 7:
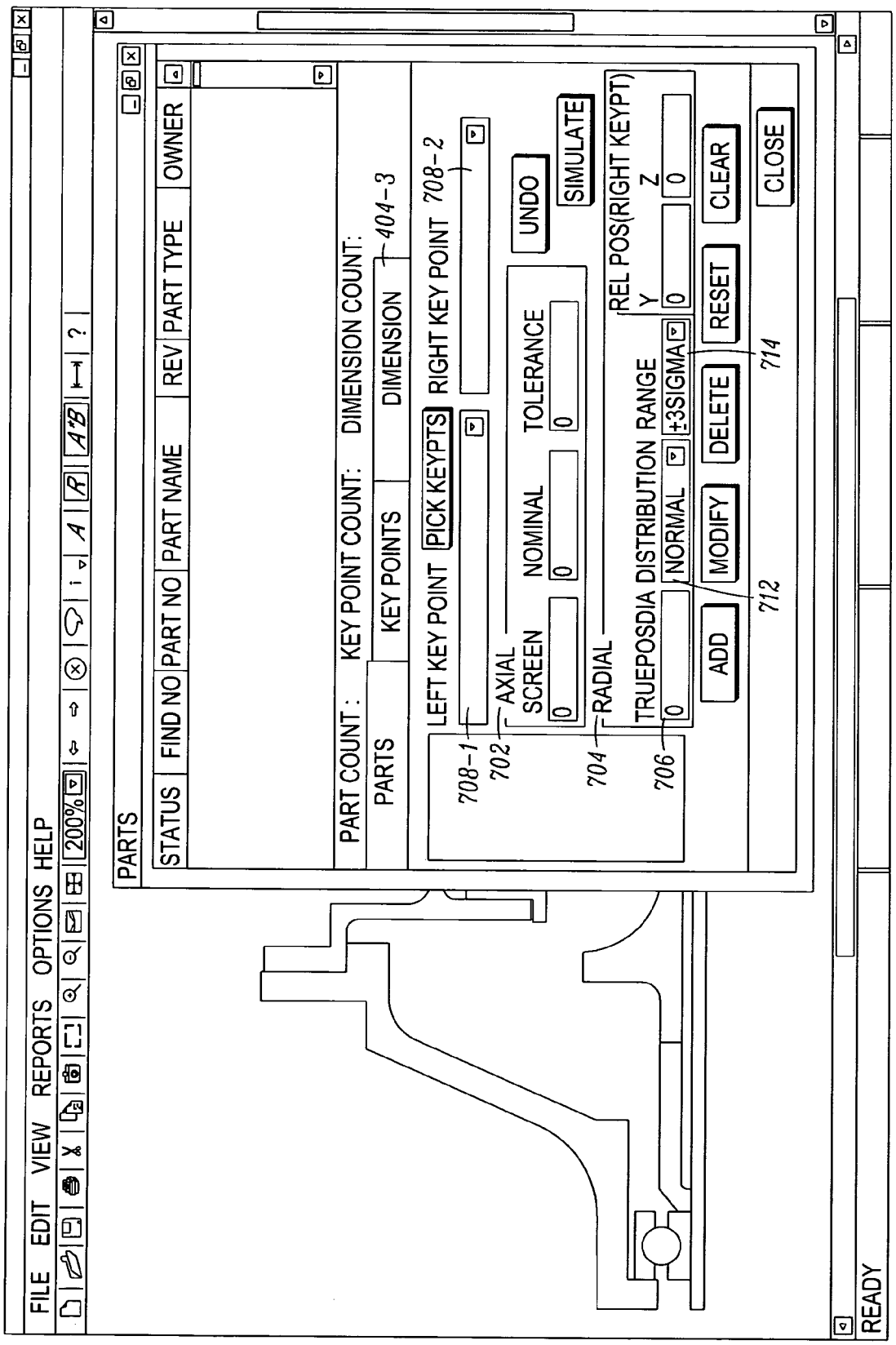

After each component 302-1 through 302-5, 304-1 through 304-7 has been assigned two or more key points 602-672, dimension data for each component are supplied. More specifically, at least in the depicted embodiment, dimension data and position data associated with the assigned key points 602-672 are supplied via a "Dimension" sub-menu 404-3, an exemplary embodiment of which is depicted in FIG. 7. It will be appreciated that these data may be axial dimension data 702, radial dimension data 704, or combined (e.g., both axial and radial) dimension data. It will additionally be appreciated that additional or other data types could also be supplied. Preferably, the dimension data associated with each key point that was entered via the "KeyPoints" sub-menu 404-2 include both a nominal dimension and a tolerance. In terms of radial dimensions, the data are preferably supplied in terms of a true position, which is input via an appropriate (e.g., TruePos) field 706. In particular, the true position field 706 is used to input positional tolerances relating two key points on a particular part that have been entered into the KeyPoint fields 708-1, 708-2. It is noted that the positional tolerance is defined by a diameter that represents the outer limit for randomly selected radii (discussed further below). In a particular preferred embodiment, the sub-menu 404-3 additionally enables a user to select an assumed distribution 708 and range 712 for the positional tolerance data supplied via the true position field 706. For example, the user may be enabled to select a normal distribution over a given range (i.e., ±1σ, ±2σ, ±3σ, etc.), or a uniform distribution. In doing so, the user is defining the probability density function that will result when a large number of random radii are generated. Preferably, appropriate dimension data are supplied for each key point 602-672 on each component of interest 302-1 through 302-6 and 304-1 through 304-7.

Before proceeding further, it is noted that in the above-described embodiment the data associated with identified parts is input manually by a user. The data that the user inputs is derived from the drawings associated with the rotating machine 300 that is being rendered. It will be appreciated that in an alternative embodiment, these data may be automatically retrieved from the drawings stored in the drawing database 108, or from a separate dimension database 118, which is depicted in phantom in FIG. 1.

Figure 2:
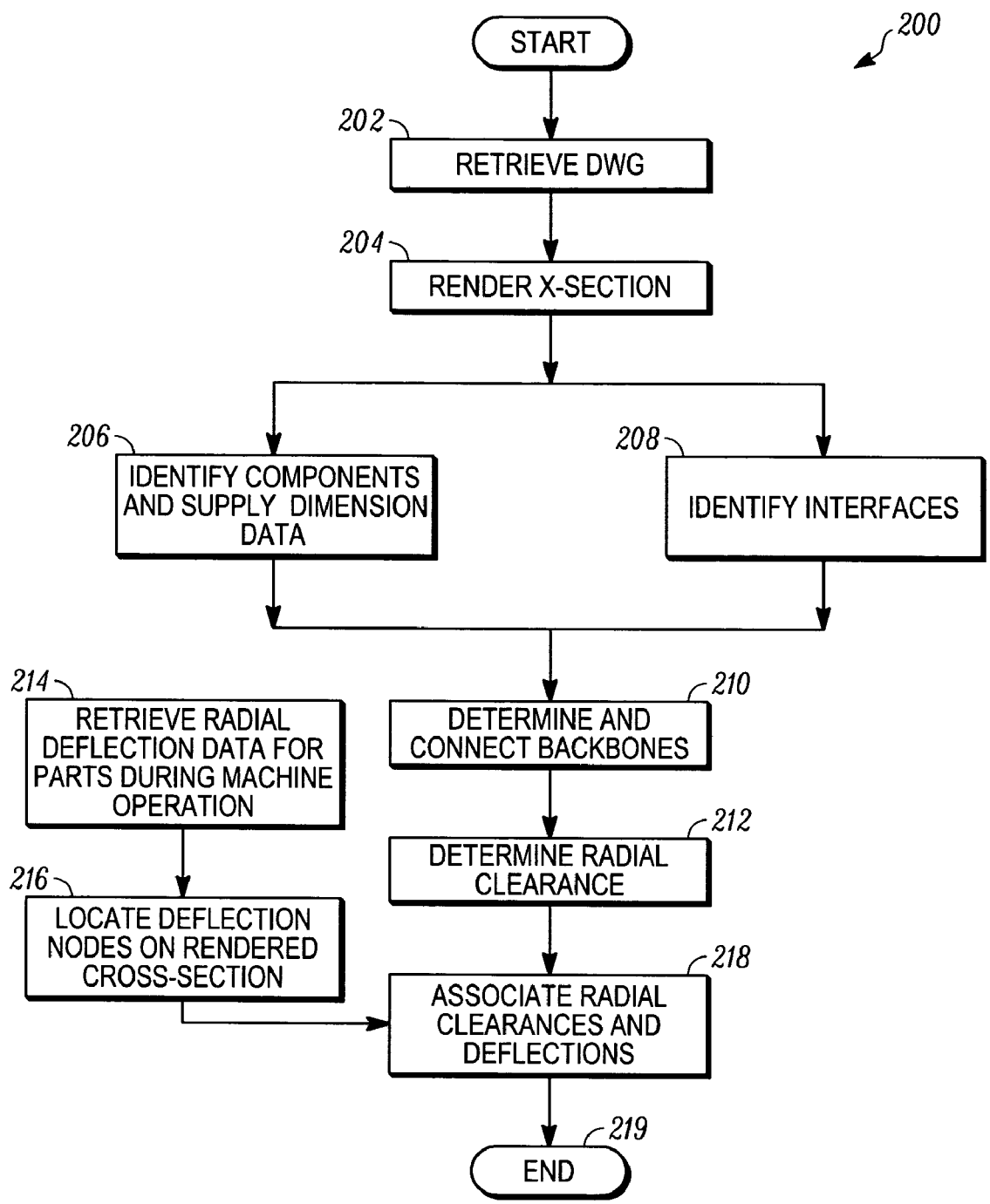
FIG. 2 is a flowchart depicting an exemplary method that may be implemented by the system of FIG. 1 for generating radial stack data for a machine.
Figure 8:
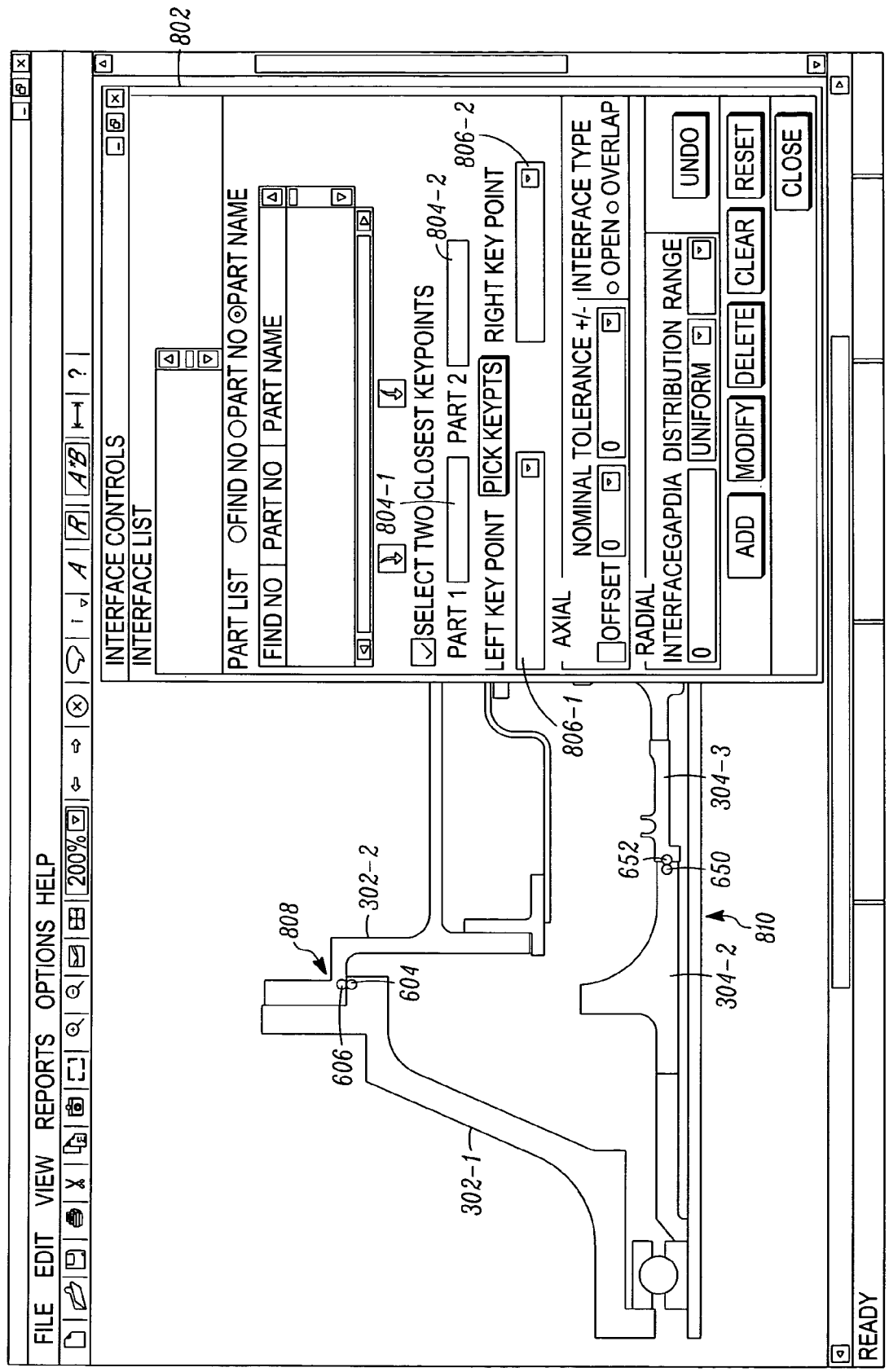

Returning now to the description of the process 200, and with reference once again to FIG. 2, it is seen that in addition to supplying dimension data associated with identified parts, interfaces between individual parts of the machine 300 are also identified (208). It is noted that this may be done substantially simultaneously with supplying the dimension data, as depicted in FIG. 2, or it may be done before or after this step. It is additionally noted that interface identification may be conducted according to any one of numerous techniques. However, in a particular preferred embodiment, which is depicted in FIG. 8, interfaces are identified on the rendered cross section using a dialog box 802 that is selected from, for example, a displayed menu. The dialog box 802 may be configured in any one of numerous ways, but in the depicted embodiment it at least includes fields in which to identify the two parts 804-1, 804-2, and the two key points on two parts 806-1 806-2, that define an interface, and to classify each identified interface as an axial interface, a radial interface, or a combined interface. For example, in the depicted rotating machine 300, a radial interface 808 between static parts 302-1 and 302-2 may be identified at key points 604 and 606, respectively, and an axial interface 810 may be identified between rotating parts 304-2 and 304-3 at points 650 and 652, respectively. If radial gap data at an identified radial interface is known, then these data may be supplied. Otherwise, the radial gap is calculated using a preferred methodology that is described further below.

Returning again to FIG. 2, it is seen that after all of the appropriate parts have been identified, all of the appropriate dimension data have been supplied, and all of the appropriate interfaces have been identified, vector loop paths through the static section 302 and the rotating section 304 are determined and connected (210). The individual vector loop paths, which are referred to herein as the static backbone and the rotating backbone, define structural paths through the static 302 and rotating 304 sections, respectively. The static and rotating backbones, after being determined, are preferably connected together at the main static/rotating section interfaces, which in the depicted embodiment are the bearing assemblies 304-6, 304-7.

Figure 9:
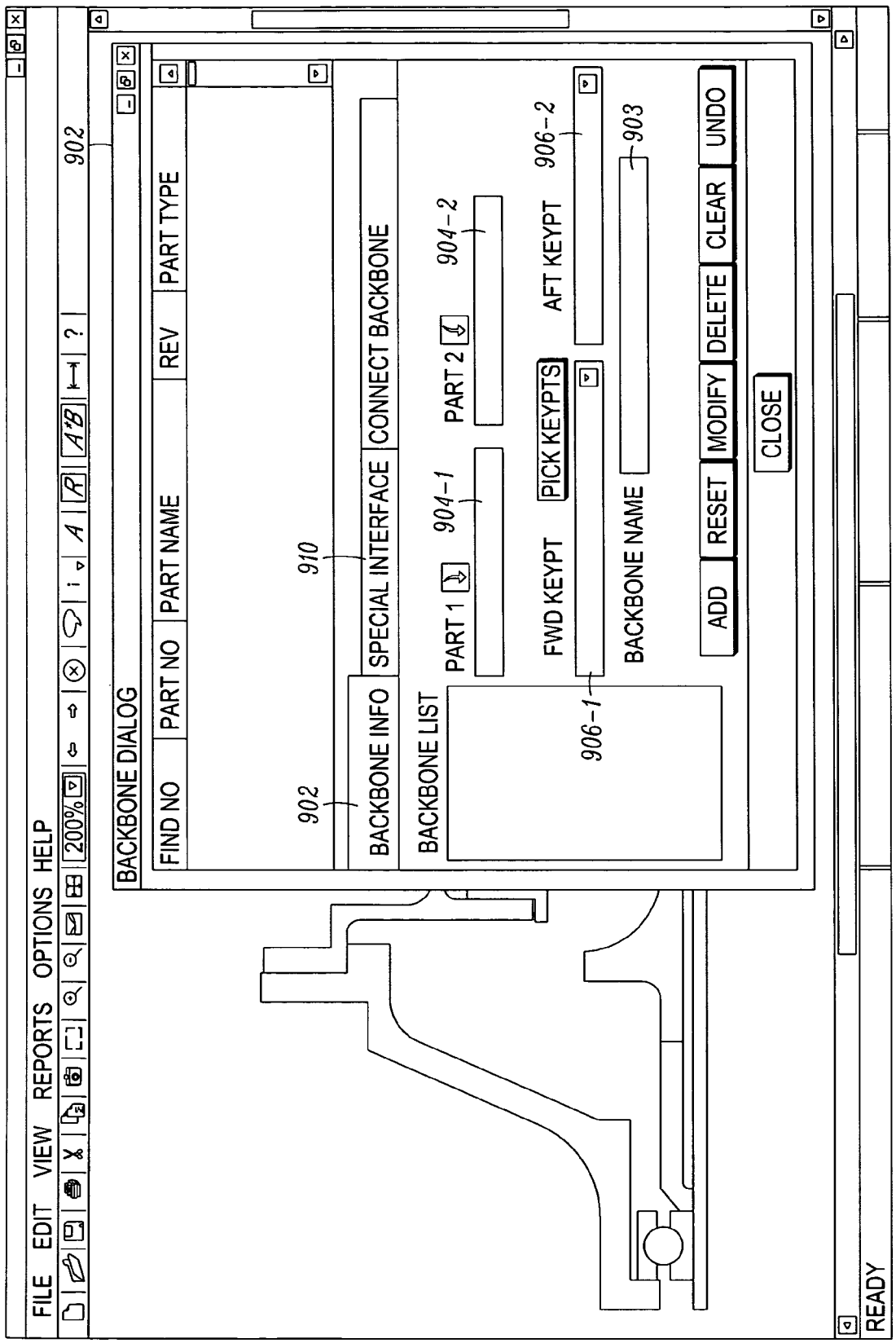
Figure 10:
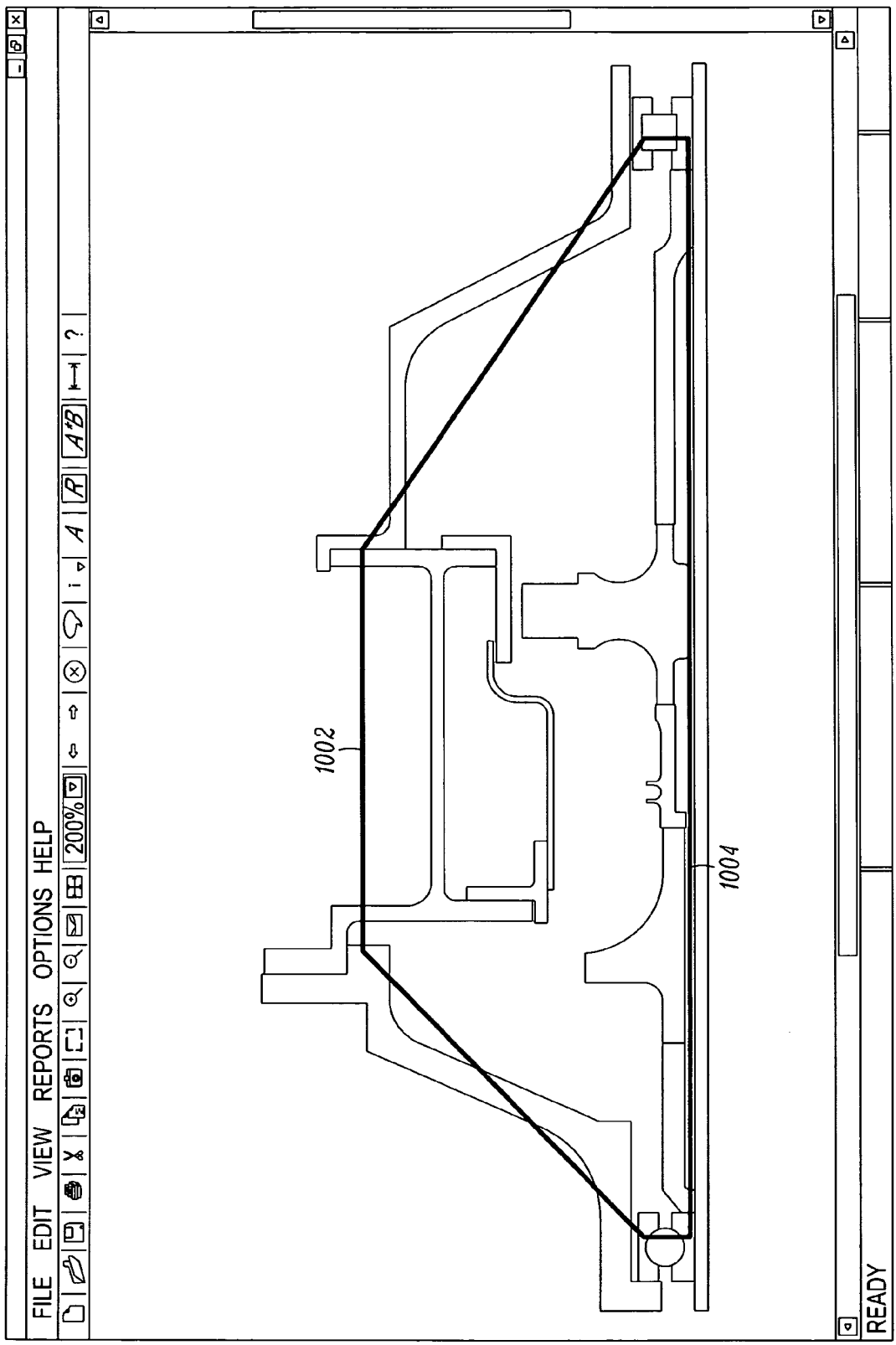

The static and rotating backbones may be determined using any one of numerous techniques, but in the depicted embodiment the backbones are each determined in response to a user identifying two parts, and associated key points, between which the appropriate vector loop should extend, and which defines the backbone. This may be accomplished in any one of numerous ways, but in the depicted embodiment, and as shown in FIG. 9, a user does so using a dialog box 902 that is selected from, for example, a displayed menu. When this dialog box 902 is displayed, a user can assign a name to a backbone 903, and identify the two parts 904-1, 904-2, and the key points 906-1, 906-2 on the two parts, that define the end points of the backbone. After these data are entered, the appropriate backbone is determined, either automatically or in response to a user input to the user interface 104. In a particular preferred embodiment, the backbones are determined by conducting an exhaustive search, going through multiple permutations and combinations of multiple dimensions and interfaces, until the end keypoints of each backbone are connected. In addition, after each backbone determination is made each may be rendered, either automatically or selectively, on the displayed cross section of the rotating machine 300. An exemplary method of how the static backbone 1002 and rotating backbone 1004 may be rendered is depicted in FIG. 10. It will be appreciated that the static backbone 1002 and rotating backbone 1004 may be selectively rendered, either individually or together, in response to a user selecting an item from a displayed menu. In an alternative embodiment, the backbones 1002, 1004 may not be rendered at all. It will be appreciated that some machines may be configured such that more than one static backbone and/or more than one rotating backbone may be determined. For example, it was noted above that some machines could include more than one rotating section. In such machines, a bearing assembly may be disposed between the two rotating sections. A so-called "special interface" is defined at this bearing assembly so that the appropriate backbone stack path for subsequent radial gap calculations (described below) may be determined. As FIG. 9 further depicts, a "Special Interface" tab 910 may be provided for this functionality. Moreover, for gaps between two static components or two rotating components connected to the same rotating backbone, the stack path may be computed directly. More specifically, because there are no bearing assemblies between the parts, the calculation of theoretical centerlines and subsequent eccentricity calculations, which are described in more detail further below, are not necessary.

Figure 11:
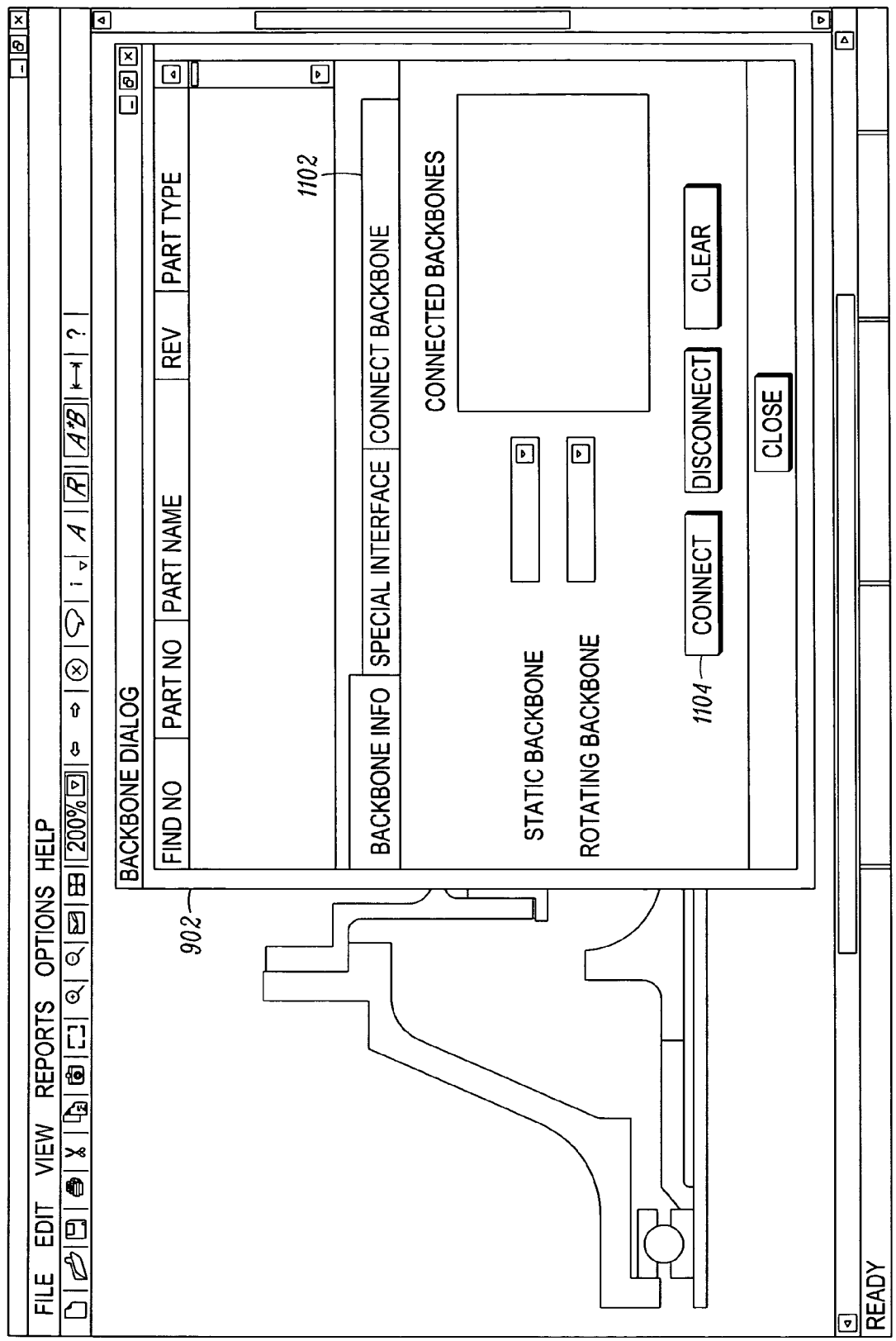

No matter the particular number of backbones 1002, 1004, after each is determined, each static backbone 1002 is preferably connected to its corresponding rotating backbones 1004. As with various other steps previously described herein, this may be accomplished in any one of numerous ways, but in the depicted embodiment, and as shown in FIG. 11, it is accomplished via a dialog box that is selected from, for example, a displayed menu. As depicted in FIG. 11, the dialog box 902 is preferably the same dialog box 902 that is used to create the backbones 1002, 1004, and that includes a separate "Connect Backbone" sub-menu tab 1102. No matter the particular manner in which it is implemented, when the appropriate dialog box 902 is displayed and the appropriate sub-menu tab 1102 is selected, a user can input, or select from a list, a static backbone 1002 and a rotating backbone 1004.

After selection, the static and rotating backbones 1002, 1004 are connected, either automatically or in response to a user input to the dialog box 1104 via the user interface 104.

After the static and rotating backbones 1002, 1004 have been determined and connected, the radial clearance (or gap) between at least two parts in the rotating machine 300 may be determined (212). Preferably, this portion of the process 200 is initiated via another drop down dialog box, such as the one depicted in FIG. 12. The dialog box 1202 allows a user to select a particular radial gap of interest between two parts. The radial gap may be selected from a list of previously identified and named radial gaps 1204-1, 1204-2, or by identifying the key points 1206-1, 1206-2 on two parts between which a radial gap determination is desired. No matter how the particular radial gap of interest is specifically identified, thereafter the process 200 automatically determines a radial stack path between the two identified parts or key points, and then determines the radial clearance between the two parts, based at least in part on the determined radial stack path. In a particular preferred embodiment, and as FIG. 12 also depicts, various data associated with the determined radial clearance are preferably rendered in the dialog box 1202, and the radial stack path 1208 is preferably rendered on the display device over the rendered cross section. In particular, in at least the depicted embodiment, the radial gap data that are generated include the average clearance 1210 (e.g., (Average=nominal diameter outer part+nominal diameter inner part)/2), the concentric minimum gap 1212 (e.g., ConcMin=Average−(outer part tolerance+inner part tolerance)/2), the concentric maximum gap 1214 (e.g., ConcMax=Average+(outer part tolerance+inner part tolerance)/2), the eccentric mean minimum gap 1216 (e.g., EccMeanMin=Meat (MinGap), where MinGap=((diameter outer part−diameter inner part)/2)−(eccentricity between the parts)), and the eccentric minus 3σ minimum gap 1218 (e.g., Ecc-3Sigma Min=Mean(MinGap)−3×(Standard Deviation(MinGap)). It will be appreciated that these particular data are merely exemplary, and that other data could in addition, or instead, be generated that are suitably representative of the radial clearance.

The radial gap between components may be determined in accordance with any one of numerous techniques, but in a particular preferred embodiment a Monte Carlo algorithm is used to make these determinations. In particular, the Monte Carlo algorithm simulates building a plurality of machines, using the dimension data associated with at least the components that lie along the radial stack path 1208 (and associated backbones, if required), and various statistical assumptions associated with certain of these data. Although the particular algorithmic steps and assumptions may vary, a particular preferred algorithm is depicted in flowchart form in FIG. 13, and with reference thereto will now be described. Before doing so it is noted that the algorithm is described as being applied to the machine 300 depicted in FIG. 3.

Figure 14:
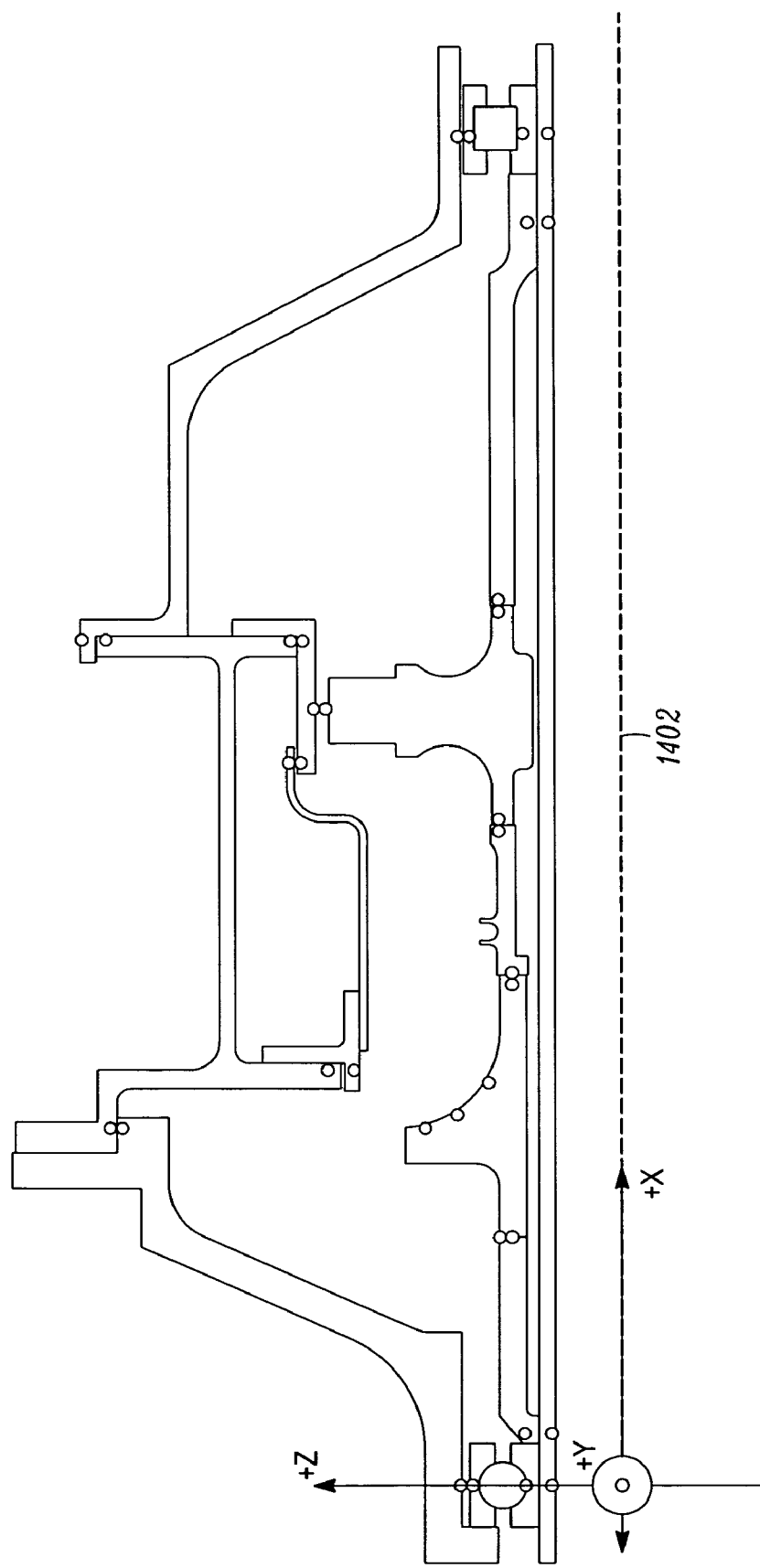
FIG. 14 is an additional exemplary screen shot of an image that may be rendered on a display, using the system of FIG. 1, in implementing the exemplary method of FIG. 2.
Figure 15:
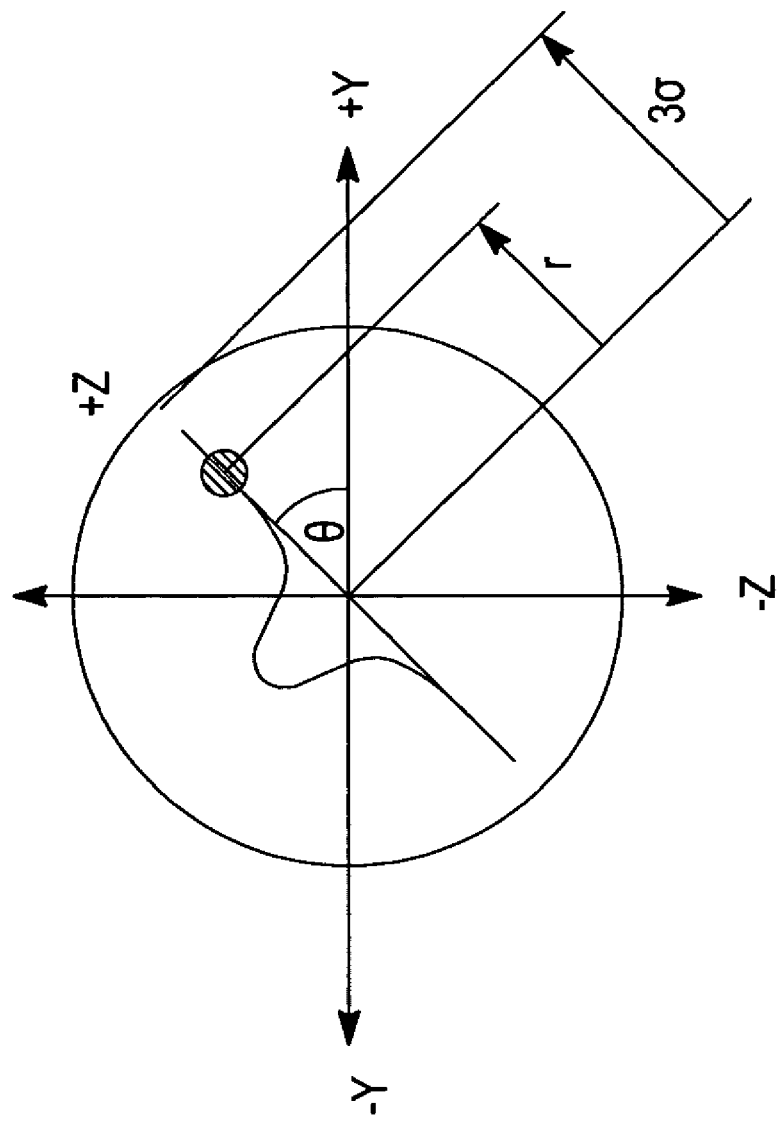
FIG. 15 depicts an exemplary methodology as to how positional relationships are randomly selected for the exemplary method of FIG. 13.

Initially, it is seen that the algorithm randomly assigns a diameter to each key point 602-672 (1302). In making these assignments, various assumptions may be made, as discussed above. For example, it may be assumed that the supplied diameter dimensions are nominal dimensions with a normal distribution, and have a ±3σ tolerance. The algorithm then randomly selects positional relationships for the individual parts at the associated key points (1304). Preferably, the position relationships are expressed using polar coordinates (e.g., $(r, \theta)$) that are based on the Cartesian coordinate system depicted in FIG. 14, in which the origin is located on the machine centerline 1402, and specifically at centers of the diameters of key points 602, 630 associated therewith that define the forward connection between the static backbone 1002 and the rotating backbone 1004 (not depicted in FIG. 14). It is further seen in FIG. 14 that the positive x-axis extends from the origin toward the aft portion of the machine 300 (e.g., to the right in FIG. 14), the positive z-axis extends from the origin upwardly with respect to the view in FIG. 14, and the positive y-axis extends from the origin into the page with respect to the view in FIG. 14. With quick reference to FIG. 15, it is noted that in randomly selecting the positional relationships, the true position diameters may be assumed to represent a ±3σ radial eccentricity from one key point to another key point, with an equal likelihood of occurrence in any direction in the y-z plane, or any one of numerous user selectable distributions.

In addition to the above, and with reference once again to FIG. 13, the algorithm determines the clearances at any identified interfaces based on the diameters randomly assigned to the associated key points (1306). The algorithm then randomly selects positional relationships from interface gaps (1308), using the same method as that used for true position, again the radial coordinate (r) may be selected from any one of numerous user selectable distributions. It is noted that after the positional relationships from interface gaps are randomly selected, all of the key points 602-672 will have been assigned a position coordinate $(r, \theta)$. Moreover, before proceeding it is further noted that in the depicted embodiment key points 602 and 630 are each assigned positions at the origin (e.g., r=0, θ=0).

With the above data selected, the algorithm then determines a sequential location path (e.g., the y-position and z-position) of the key points 602-628 in the static backbone 1002, and the key points 630-672 in the rotating backbone 1004 (1310). In the depicted embodiment this determination is made in accordance with the following:

$$y_{604} = (r_{604})(\cos(\theta_{604})), z_{604} = (r_{604})(\sin(\theta_{604}))$$

$$y_{606} = y_{604} + (r_{606})(\cos(\theta_{606})), z_{606} = z_{604} + (r_{606})(\sin(\theta_{606}))$$

$$\vdots$$

It will be appreciated that the sequential order of calculation preferably depends on the stack path defined by the interfaces.

After the sequential location paths of the key points 602-672 have been determined, theoretical centerlines are separately established for any backbones defined by a user in the backbone dialog box 902 (1312). In a particular preferred embodiment, and using the example machine 300 depicted herein, these theoretical centerlines are established in accordance with the following:

$$y = y_{628}/x_{628}, z = z_{628}/x_{628} \text{ (for the static group), and}$$

$$y = y_{672}/x_{672}, z = z_{672}/x_{672} \text{ (for the rotating group).}$$

With the theoretical centerlines established, centerline offsets (or eccentricities) for all of the key points 604-628, 632-672 may then be determined (1314). In a particular preferred embodiment, and using the example machine 300 depicted herein, these eccentricities are determined in accordance with the following for each key point 604-628, 632-672:

$$e_{ny} = y_n - [(y_{672}/x_{672})(x_n)]$$

$$e_{nz} = z_n - [(z_{672}/x_{672})(x_n)]$$

$$e_n = (e_{ny}^2 + e_{nz}^2)^{1/2},$$

for the rotating section 302, and $$e_{ny} = y_n - [(y_{628}/x_{628})(x_n)]$$

$$e_{nz} = z_n - [(z_{628}/x_{628})(x_n)]$$

$$e_n = (e_{ny}^2 + e_{nz}^2)^{1/2},$$

for the static section 304.

After all of the previous data have been determined for the current machine build, the algorithm then determines the radial gap of interest that was previously selected (1316). To do so, the algorithm uses the diameters for the associated key points that were randomly selected, and the determined eccentricities associated with the key points. In a particular preferred embodiment, and using the example machine 300 depicted herein, the radial gap between the key point 626 and the key point 658 is determined by subtracting the determined eccentricities from the randomly selected diameters.

Figure 12:
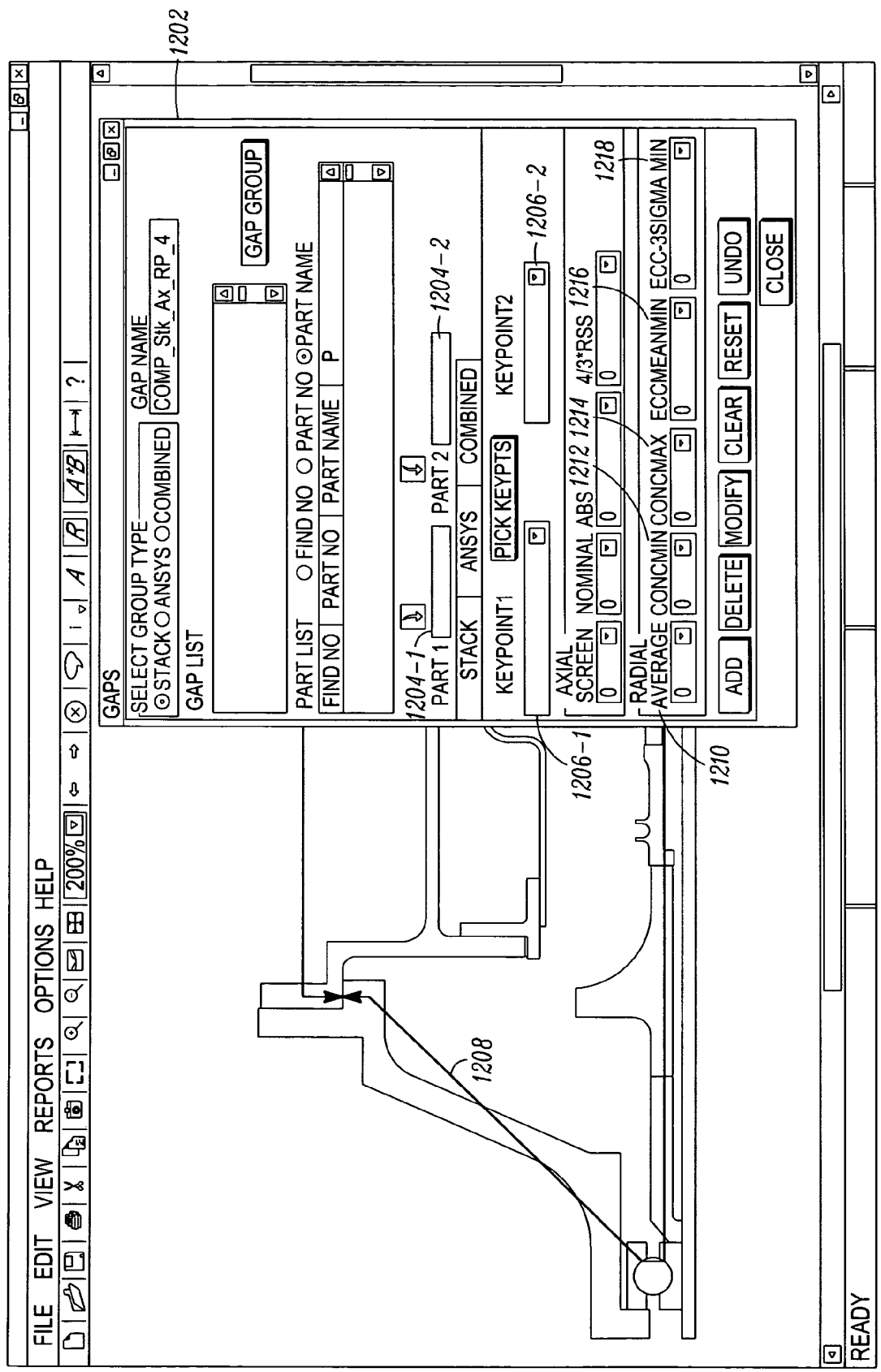
Figure 13:
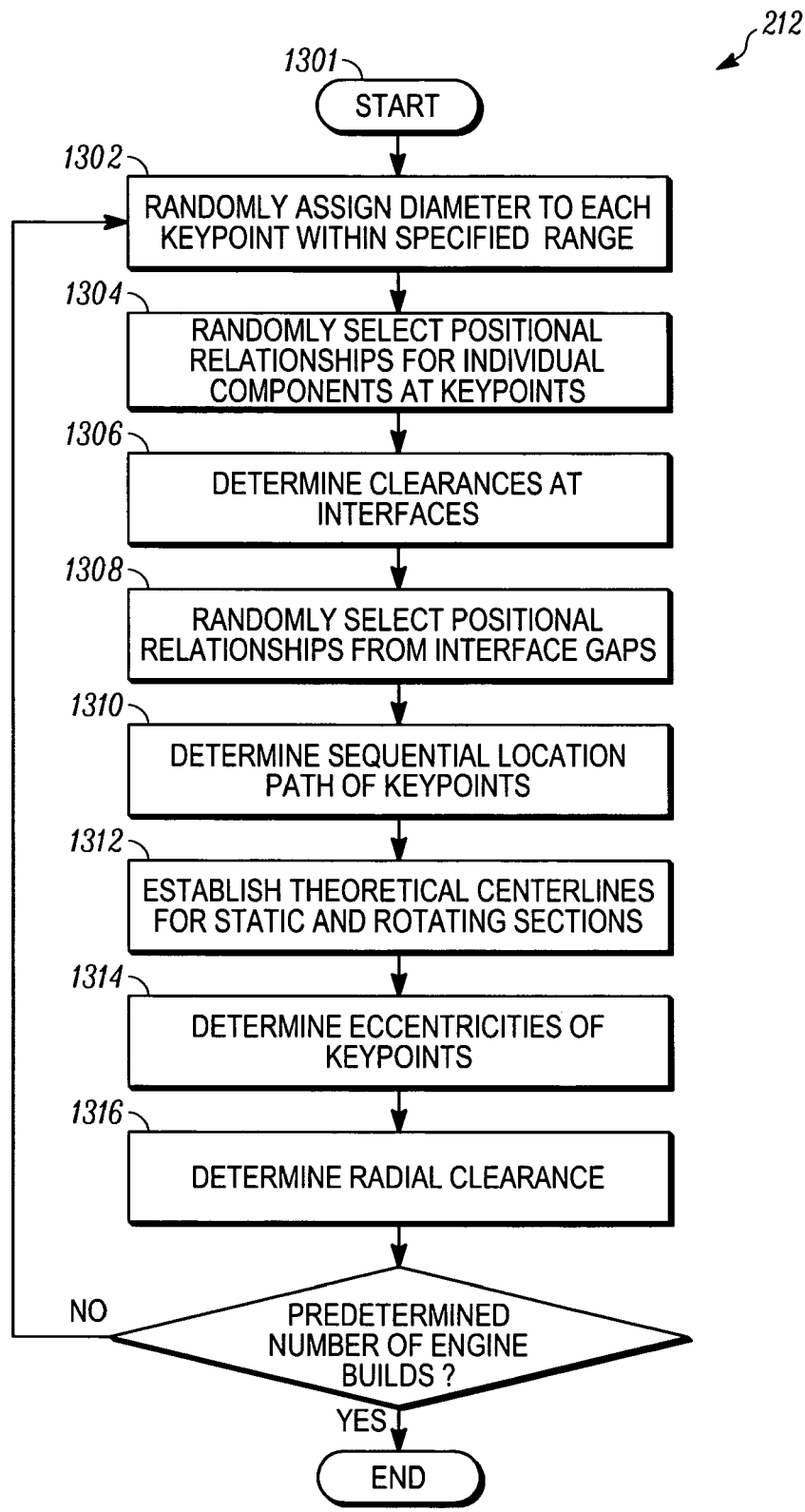
FIG. 13 is a flowchart depicting an exemplary method that may be used to implement a particular step of the exemplary method depicted in FIG. 2.

It is then seen in FIG. 13, that each of the previously described steps is repeated until a predetermined number of engine build sequences (1302-1316) have been completed. Preferably, the number of engine build sequences that are conducted is a user selectable variable, though it will be appreciated that it could be a set, predefined number. In a particular preferred embodiment, and with quick reference back to FIG. 12, it is seen that the drop down 1202 includes a field 1222 in which the number of engine build sequences may be selected. It will be appreciated that the number of engine build sequences may vary, but values from 1,000 to 10,000 are sufficient to provide suitable results. Preferably, after the predetermined number of engine build sequences is complete the mean and standard deviation ($\sigma$) associated therewith are computed, and the mean minimum gap $\pm 3\sigma$ may be selectively displayed.

Returning once again to FIG. 2, in addition to determining the radial clearance between components during static, non-operational conditions, the radial deflections of various components is also determined (214). In particular, a deflection analysis model of the machine 300 is separately run to determine the radial deflections of various machine components at one or more machine operating conditions, and data associated with these analyses are imported. Although data from any one of numerous deflection analyses could be used, in a particular preferred embodiment, data generated by a finite element analysis software model, such as the well-known ANSYS finite element analysis software model, are used. It will be appreciated that deflection estimate data could also be used.

Figure 16:
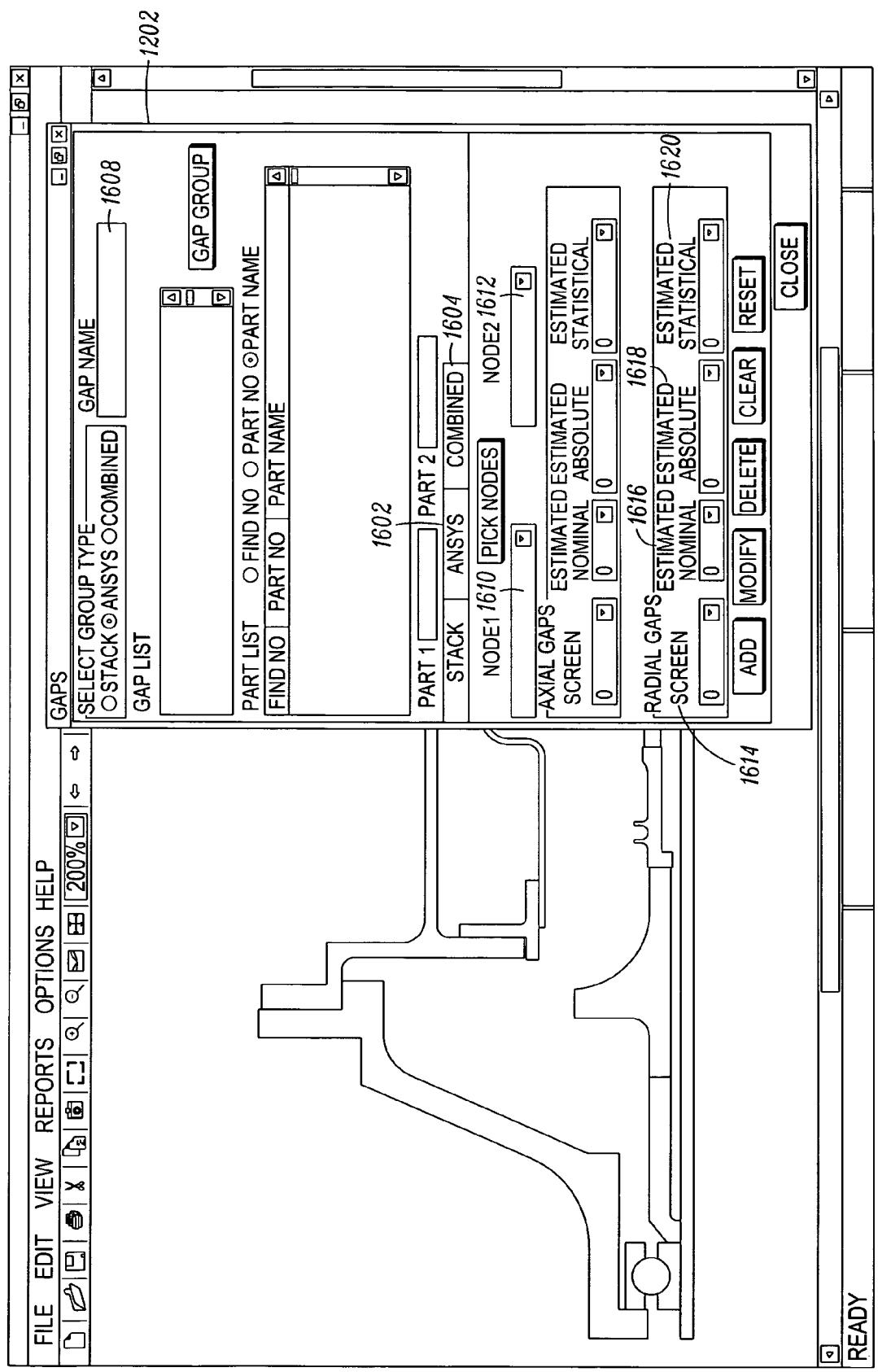
FIGS. 16-18 are additional exemplary screen shot of an image that may be rendered on a display, using the system of FIG. 1, in implementing the exemplary method of FIG. 2.
Figure 17:
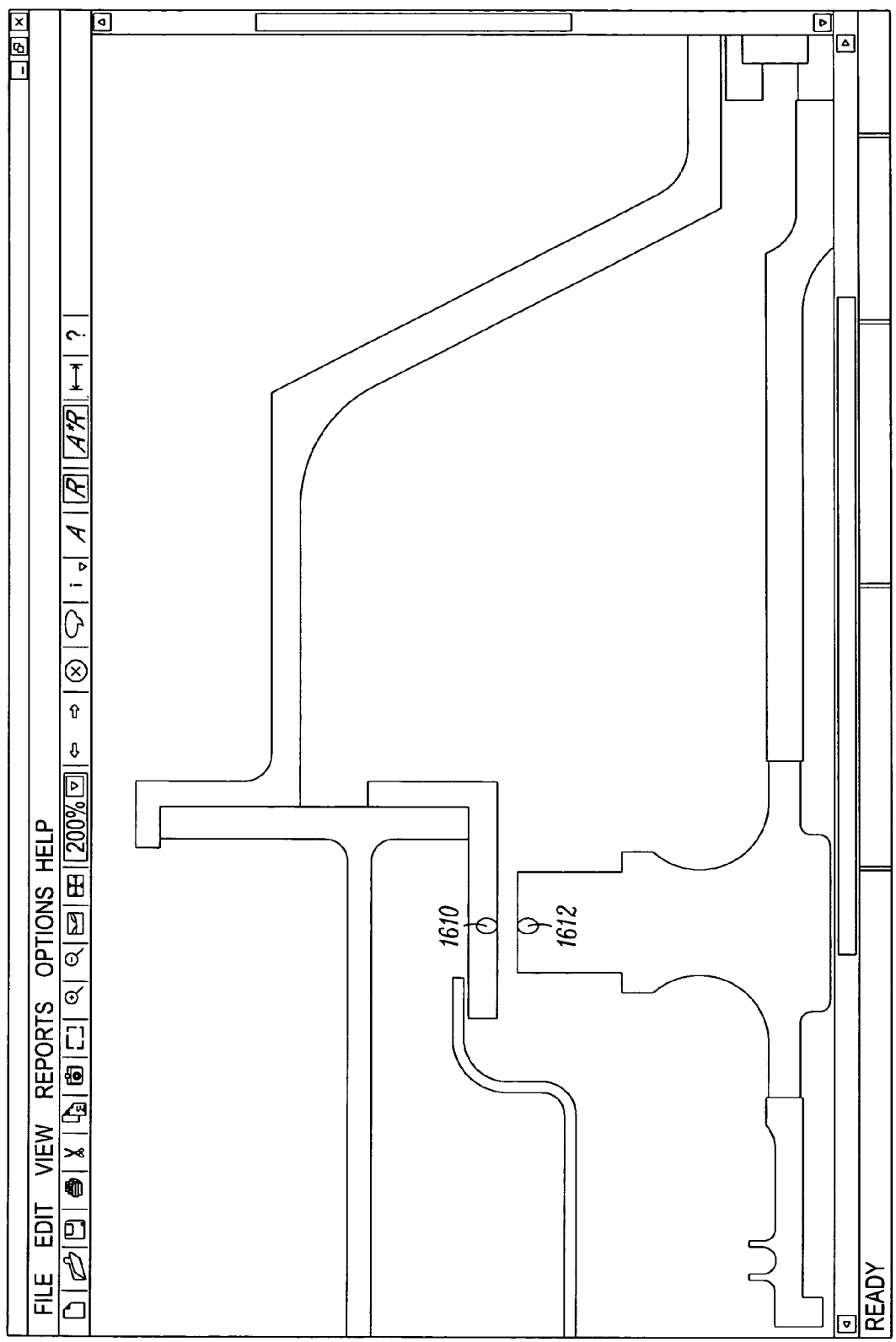

No matter the particular deflection analysis that is used to generate the data, the resultant data for the particular machine 300 are retrieved and selectively associated therewith. In particular, and with reference now to FIG. 16, it is seen that the dialog box 1202 that is used to select a particular radial gap of interest between two parts, includes additional sub-menus 1602, 1604 that are respectively used to generate radial stack gap data from the above-mentioned deflection analysis model, and to generate combined gap data for a selected radial stack gap. The combined gap data that are generated are data representative of both the radial clearance data during machine 300 non-operational conditions and the radial deflections during machine 300 operation at one or more machine operating conditions, as determined using the deflection analysis model. More specifically, and with specific reference to FIG. 16, the first sub-menu 1602 includes suitable fields for selecting gap names 1608, and two nodes 1610, 1612 from the deflection analysis model associated with the machine 300. As shown in FIG. 17, upon selection of the nodes, and after appropriate input from a user via the user interface 104, the nodes 1610, 1612, are rendered on the cross section of the machine 300.

Returning once again to FIG. 16, it is noted that, upon selection of the type of gap (e.g., axial or radial) 1606, the appropriate data fields 1614-1620 are populated. In the depicted embodiment, since the selected gap type is a radial gap, the data fields 1614-1620 are populated with data representative of the radial deflections of the nodes 1610, 1612 derived from the deflection analysis.

Figure 18:
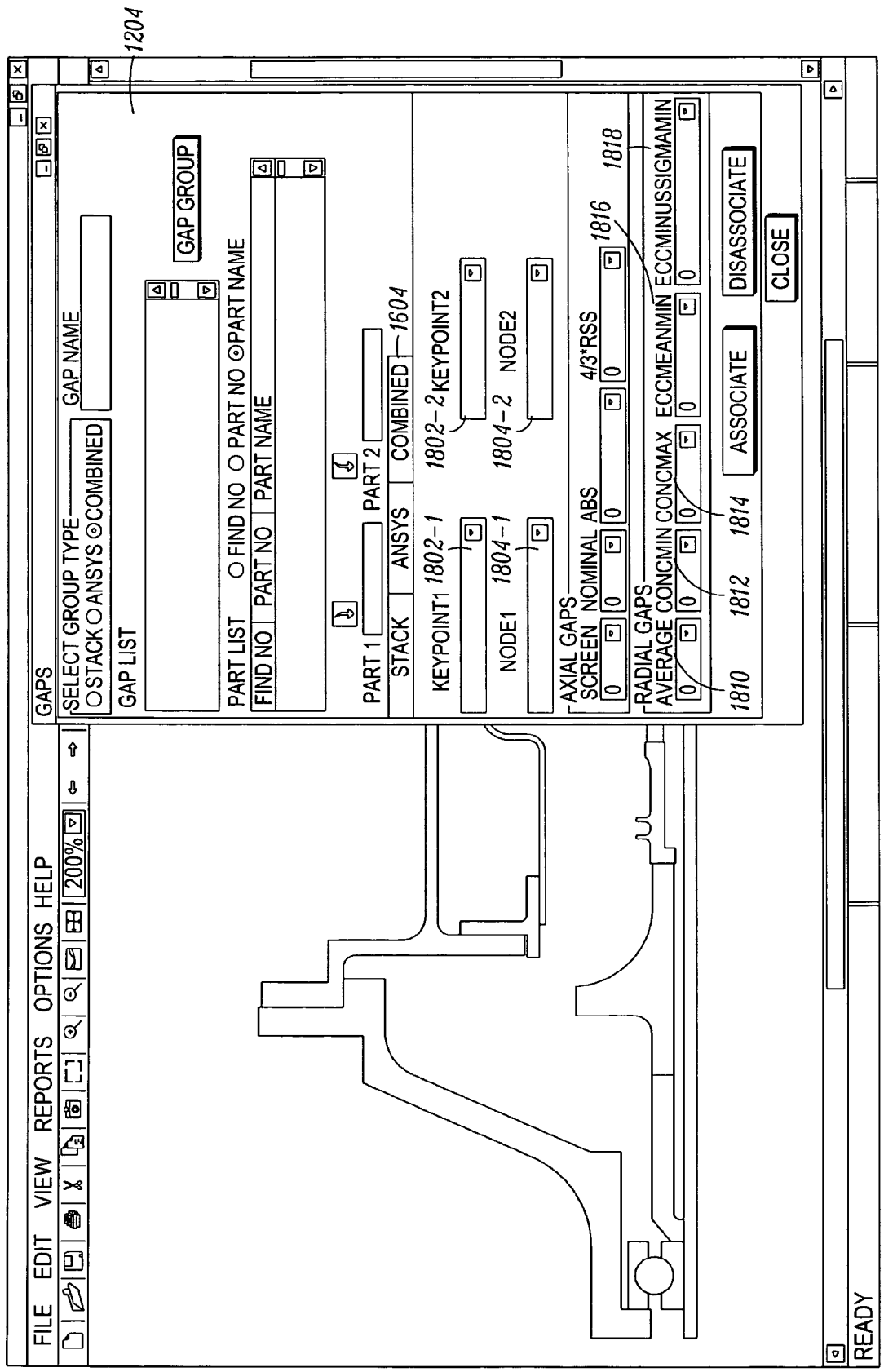

With reference now to FIG. 18, and as was noted above, when the combined sub-menu 1604 is selected, data representative of both the radial clearance data during machine 300 non-operational conditions and the radial deflections during machine 300 operation at one or more machine operating conditions, as determined using the deflection analysis model, are generated. It is thus seen that this sub-menu 1604 includes, among others, appropriate data fields 1802-1, 1802-2 for the selection of two key points and appropriate data fields 1804-1, 1804-2 for the selection of two deflection analysis nodes with which to associate the selected key points. Upon selection of the key points and nodes, and after appropriate input from a user via the user interface 104, the data representative of the radial clearance between the two parts during the machine operation are generated and displayed in the appropriate data fields 1810-1818. These data are preferably the same data types as those associated with the non-operational clearance data previously described (e.g., 1210-1218 in FIG. 12).

Figure 19:
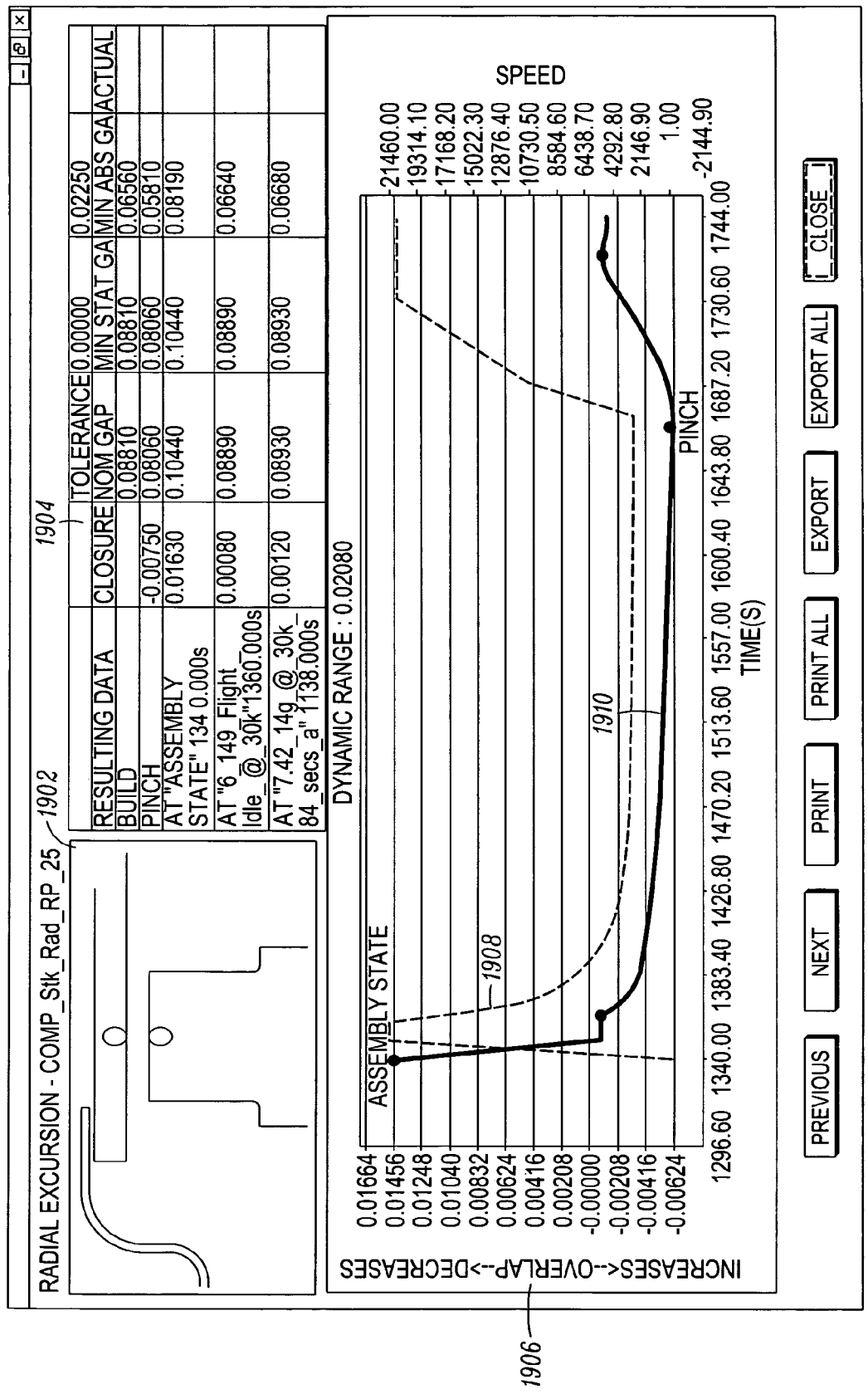
FIGS. 19 and 20 are screen shots of exemplary reports that may be generated from data that are generated from the exemplary method depicted in FIG. 2.
Figure 20:
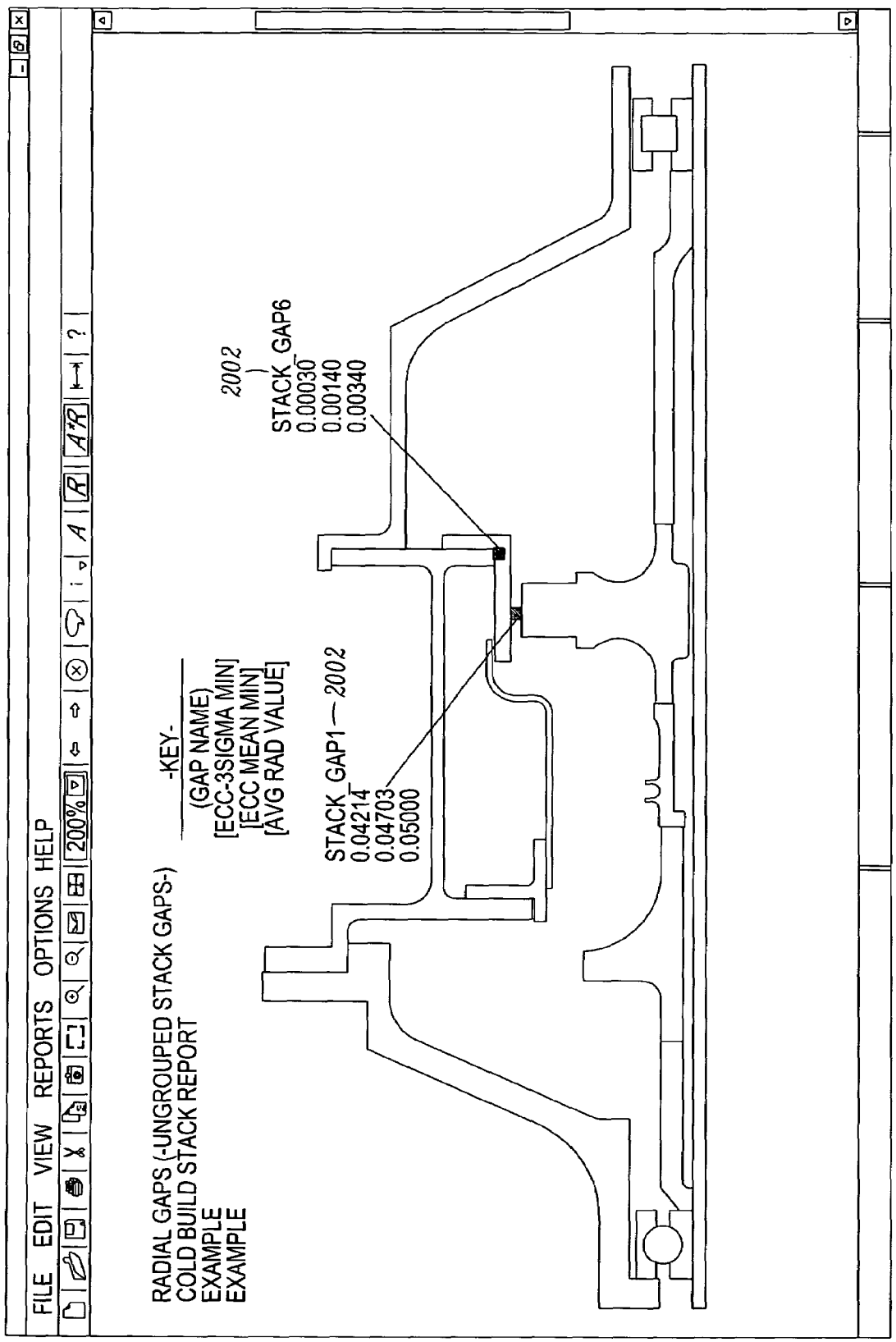

In addition to the data that are generated and supplied in the dialog boxes 1202, 1802 depicted in FIGS. 12 and 18, respectively, and described above, the system 100 and method 200 can also be used to generate numerous and varied reports. The reports can provide textual, graphic, or combined textual and graphic data associated with non-operational radial clearances, textual, graphic, or combined textual and graphic data that result from the radial deflection analysis model, and textual, graphic, or combined textual and graphic data associated with the radial clearance between the two parts during the machine operation. For example, FIG. 19 depicts an exemplary report that combines textual and graphic data and includes a close-up view 1902 of the gap for which the report is associated, a table of textual data 1904 associated with the gap, and a graph 1906 that includes a plot of the operating conditions 1908 of the machine 300 with time and the radial deflection 1910 with time. FIG. 20 depicts an exemplary radial stack cross section report that provides radial stack gap data 2002 for user-selected radial gaps. Again, the depicted reports are merely exemplary of any one of numerous types of reports that may be generated from the data that results from the system 100 implementing the method 200 described herein.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A method of generating radial clearance data for a radial clearance between locations on at least two parts in a machine, the method comprising the steps of:
   rendering an image of a cross section view of at least a portion of the machine on a display;
   identifying the locations on the two parts on the rendered cross section;
   automatically determining a radial stack path between the identified locations;
   supplying dimension data for at least components within the machine through which the radial stack path extends, the dimension data for each component including a nominal dimension and an associated tolerance;
   determining the radial clearance between the two parts
   determining the radial clearance between the two parts in three dimensions when the machine is not operating, based at least in part on the determined radial stack path and using a Monte Carlo algorithm that simulates building a plurality of machines and accounts for the nominal dimension and associated tolerance for each component;
   using deflection data representative of radial deflections of at least the identified locations during machine operation at one or more machine operating conditions; and
   generating data representative of the radial clearance between the identified during the machine operation at the one or more machine operating conditions.

2. The method of claim 1, further comprising:
   identifying interfaces between individual parts of the machine.

3. The method of claim 1, further comprising:
   rendering an image of the radial stack path on the rendered cross section view.

4. The method of claim 1, wherein the dimension data are supplied via a first user interface.

5. The method of claim 4, further comprising:
   selectively identifying each component on the rendered cross section via a second user interface; and
   supplying the dimension data for each component via the first user interface in response to the selective identification thereof 6. The method of claim 1, further comprising:
   selectively changing the dimension data for one or more of the components to new dimension data; and
   automatically updating the radial clearance between the two parts based on the new dimension data.

7. The method of claim 1, wherein the dimension data are selectively retrieved from a database having the dimension data stored therein.

8. The method of claim 1, further comprising:
   selectively outputting the dimension data for at least the components within the machine through which the radial stack path extends.

9. The method of claim 1, further comprising:
   selectively outputting statistical data associated with the Monte Carlo algorithm determined radial clearance.

10. The method of claim 1, further comprising:
    using the deflection data that are generated by a deflection analysis model of the machine during a plurality of different predetermined conditions; and
    generating data representative of the radial clearance between the identified locations during each of the plurality of predetermined conditions.

11. The method of claim 10, wherein the plurality of predetermined conditions are steady-state conditions.

12. The method of claim 10, wherein the plurality of predetermined conditions are transient conditions.

13. The method of claim 10, wherein the deflection analysis model is a finite element thermal design model.

14. The method of claim 1, wherein:
    the two parts include a rotating part and a static part.

15. The method of claim 14, further comprising:
    identifying a rotational backbone structure to which the rotating part is coupled; and
    identifying a static backbone structure to which the static part is coupled, the static backbone structure disposed radially outward of at least a portion of the rotational backbone structure.

16. The method of claim 15, wherein:
    the rotational and static backbone structures each comprise a plurality of axially and radially interfacing components, each of the axially interfacing components having dimension data associated therewith that includes a nominal dimension and an associated tolerance;
    the radial stack path between the two parts is determined using the identified rotational and static backbone structures; and
    the radial clearance between the identified components when the machine is not operating is further determined based on the dimension data associated with the axially and radially interfacing components that comprise the rotational and static backbones.

17. A system for generating radial clearance data for a radial clearance between locations on at least two parts in a machine, comprising:
    a display device responsive to image rendering display commands to render one or more images;
    an image database having image data stored therein representative of at least portions of one or more rotating machines;
    a user interface configured to receive user input and supply user input commands;
    a processor in operable communication with the display device, the image database, and the user interface, the processor configured, upon receipt of user input commands from the user interface, to:
    selectively retrieve image data from the image data base,
    command an image of a cross section view of at least a portion of the rotating machine to be displayed on the display device,
    identify the locations on the two parts on the rendered cross section, automatically determine a radial stack path between the identified locations,
    supply dimension data for at least components within the machine through which the radial stack path extends, the dimension data for each component including a nominal dimension and an associated tolerance,
    determine the radial clearance between the identified locations in three dimensions when the machine is not operating, based at least in part on the determined radial stack path and using a Monte Carlo algorithm that simulates building a plurality of machines and accounts for the nominal dimension and associated tolerance for each component,
    receive deflection data representative of radial deflections of the two parts during machine operation at one or more machine operating conditions, and
    generate data representative of the radial clearance between the identified locations during the machine operation at the one or more machine operating conditions.

18. Computer-readable media having computer program instructions stored thereon for execution by a computer, the computer program adapting the computer to implement a method of generating radial clearance data for a radial clearance between locations on at least two parts in a machine, the method comprising the steps of:

rendering an image of a cross section view of at least a portion of the machine on a display;

identifying the locations on the two parts on the rendered cross section;

automatically determining a radial stack path between the identified locations;

supplying dimension data for at least components within the machine through which the radial stack path extends, the dimension data for each component including a nominal dimension and an associated tolerance;

determining the radial clearance between the identified locations in three dimensions when the machine is not operating, based at least in part on the determined radial stack path and using a Monte Carlo algorithm that simulates building a plurality of machines and accounts for the nominal dimension and associated tolerance for each component;

using deflection data representative of radial deflections of the identified locations during machine operation at one or more machine operating conditions; and generating data representative of the radial clearance between the identified locations during the machine operation at the one or more machine operating conditions.

* * * * *